(12) United States Patent
Yamamoto et al.

(10) Patent No.: US 12,176,450 B2
(45) Date of Patent: Dec. 24, 2024

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Naoyuki Nakagawa, Tokyo (JP); Yukitami Mizuno, Tokyo (JP); Soichiro Shibasaki, Tokyo (JP); Yuya Honishi, Saitama Saitama (JP); Mutsuki Yamazaki, Yokohama Kanagawa (JP); Yoshiko Hiraoka, Kawasaki Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 17/938,988

(22) Filed: Sep. 7, 2022

(65) Prior Publication Data
US 2023/0017543 A1    Jan. 19, 2023

Related U.S. Application Data

(63) Continuation of application No. PCT/JP2020/038403, filed on Oct. 9, 2020.

(51) Int. Cl.
*H01L 31/072*   (2012.01)
*H01L 31/0336*  (2006.01)
*H01L 31/05*    (2014.01)

(52) U.S. Cl.
CPC ........ *H01L 31/072* (2013.01); *H01L 31/0336* (2013.01); *H01L 31/0504* (2013.01)

(58) Field of Classification Search
None
See application file for complete search history.

(56) References Cited

U.S. PATENT DOCUMENTS

2012/0285523 A1   11/2012   Negami et al.
2019/0198697 A1    6/2019   Honishi et al.
(Continued)

FOREIGN PATENT DOCUMENTS

| CN | 103646972 A | * | 3/2014 |
|----|-------------|---|--------|
| CN | 109819679   |   | 5/2019 |
| CN | 110112225   |   | 8/2019 |
| CN | 11279492    |   | 6/2020 |
| JP | 2004-214300 |   | 7/2004 |
| JP | 2005-123272 |   | 5/2005 |

(Continued)

OTHER PUBLICATIONS

S. Shibasaki, et al., "Transparent Cu2O solar cell for high-efficiency and low-cost tandem photovoltaics", 2019 IEEE 46th Photovoltaic Specialists Conference (PVSC), Jun. 16-21, 2019,. p. 1061-1063 (Year: 2019).*

(Continued)

*Primary Examiner* — Ryan S Cannon
(74) *Attorney, Agent, or Firm* — Amin, Turocy & Watson, LLP

(57) ABSTRACT

A solar cell of an embodiment includes a p-electrode, an n-electrode, a p-type light-absorbing layer located between the p-electrode and the n-electrode and comprising a cuprous oxide, and an n-type layer comprising a first n-type layer, which is located between the p-type light-absorbing layer and the n-electrode and comprising a defined compound aiding in conversion efficiency. The n-type layer further comprises a second n-type layer which is located between the first n-type layer and the n-electrode and mainly contains another compound aiding in conversion efficiency.

20 Claims, 9 Drawing Sheets

(56) References Cited

U.S. PATENT DOCUMENTS

2020/0194608 A1 6/2020 Yamamoto et al.
2023/0125003 A1 4/2023 Nakagawa et al.

FOREIGN PATENT DOCUMENTS

| | | |
|---|---|---|
| JP | 2012238720 A * | 12/2012 |
| JP | 2017-098479 | 6/2017 |
| JP | 6276610 | 2/2018 |
| JP | 2018-046196 | 3/2018 |
| JP | 2019-57536 | 4/2019 |
| KR | 10-2019-0089394 | 7/2019 |
| WO | 2011/090134 | 7/2011 |
| WO | 2020/059053 | 3/2020 |
| WO | 2022/074852 | 4/2022 |

OTHER PUBLICATIONS

T. Minami et al., "Cu2O-based solar cells using oxide semiconductors", Journal of Semiconductors 37(1), 014002 (Year: 2016).*
Machine translation of Cn103646972A (Year: 2014).*
Machine translation of JP2012/238720A (Year: 2012).*
Minami, et al. "Relationship between the electrical properties of the n-oxide and p-Cu20 layers and the photovoltaic properties of Cu20-based heterojunction solar cells", Solar Energy Materials and Solar Cells, Elsevier, vol. 147 (2016) 85-93.
International Search Report for International Application No. PCT/JP2020/038403 mailed on Dec. 28, 2020, 15 pgs.
Minami, et al., "Heterojunction solar cell with 6% efficiency based on an n-type aluminum-gallium-oxide thin film and p-type sodium-doped Cu2O sheet" Applied Physics Express 8, 022301 (2015).
Minami, et al., "Cu2O-based heterojunction solar cells with an Al-doped ZnO/oxide semiconductor/thermally oxidized Cu2O sheet structure", Solar Energy, 2014, vol. 105, pp. 206-217.
Chua, et al., "Enhancement of the open circuit voltage of Cu2O/Ga2O3 heterojunction solar cells through the mitigation of interfacial recombination" AIP Advances 9, 055203 (2019).
Y. Nishi, et al., "Cu2O-based heterojunction solar cells fabricated using multicomponent oxide semiconductor thin films as an n-type semiconductor layer", The Japan Society of Applied Physics The 60th JSAP Spring Meeting X Proceedings, 30a-F2-9, 2013.

* cited by examiner

|  | First n-type Layer (First Region) | | Second n-type Layer (Second Region) | | Third n-type Layer (Third Region) | |
| --- | --- | --- | --- | --- | --- | --- |
|  | Composition | Gradient | Composition | Gradient | Composition | Gradient |
| Example 1 | $Ga_{1.70}Al_{0.30}O_{3.00}$ | no | $Ga_{1.90}Al_{0.10}O_{3.00}$ | no | - | - |
| Example 2 | $Ga_{1.60}Al_{0.40}O_{3.00}$ | no | $Ga_{1.90}Al_{0.10}O_{3.00}$ | no | - | - |
| Example 3 | $Ga_{1.90}Al_{0.10}O_{3.00}$ | no | $Ga_2O_3$ | no | - | - |
| Example 4 | $Ga_{1.80}B_{0.20}O_{3.00}$ | no | $Ga_{1.90}B_{0.10}O_{3.00}$ | no | - | - |
| Example 5 | $Ga_{1.70}Al_{0.25}Ti_{0.05}O_{3.03}$ | no | $Ga_{1.85}Al_{0.10}Sn_{0.05}O_{3.03}$ | no | - | - |
| Example 6 | $Ga_{1.70}Al_{0.25}In_{0.05}O_{3.00}$ | no | $Ga_{1.85}Al_{0.10}Si_{0.05}O_{3.03}$ | no | - | - |
| Example 7 | $Ga_{1.70}Al_{0.25}Zr_{0.05}O_{3.03}$ | no | $Ga_{1.85}Al_{0.10}Sn_{0.05}O_{3.03}$ | no | - | - |
| Example 8 | $Ga_{1.70}Al_{0.25}Zn_{0.05}O_{2.98}$ | no | $Ga_{1.85}Al_{0.10}Ge_{0.05}O_{3.03}$ | no | - | - |
| Example 9 | $Ga_{1.70}Al_{0.25}Hf_{0.05}O_{3.03}$ | no | $Ga_{1.85}Al_{0.10}Sn_{0.05}O_{3.03}$ | no | - | - |
| Example 10 | $Ga_{1.70}Al_{0.25}Hf_{0.04}Sn_{0.01}O_{3.03}$ | no | $Ga_{1.85}Al_{0.10}Sn_{0.05}O_{3.03}$ | no | - | - |
| Example 11 | $Ga_{1.70}Al_{0.30}O_{3.00}$ | no | $Ga_2O_3$ | no | $Zn_{1.80}Sn_{0.20}O_{2.20}$ | no |
| Example 12 | $Ga_{1.40}Hf_{0.60}O_{3.30}$ | no | $Ga_2O_3$ | no | $Ga_{1.70}Sn_{0.30}O_{3.15}$ | no |
| Example 13 | $Ga_{1.00}Hf_{1.00}O_{3.50}$ | no | $Ga_2O_3$ | no | $Ga_{1.68}Sn_{0.30}Al_{0.02}O_{3.15}$ | no |
| Example 14 | $Ga_{1.70}Al_{0.30}O_{3.00}$ | no | $Ga_{1.90}Al_{0.10}O_{3.00}$ | no | - | - |
| Example 15 | $Ga_{1.60}Al_{0.40}O_{3.00}$ | no | $Ga_{1.90}Al_{0.10}O_{3.00}$ | no | - | - |
| Example 16 | $Ga_{1.70}Al_{0.30}O_{3.00}$ | no | $Ga_2O_3$ | no | $Zn_{1.80}Sn_{0.20}O_{2.20}$ | no |
| Example 17 | $Ga_{1.50}Al_{0.50}O_{3.00}$ | yes | $Ga_{1.85}Al_{0.10}Sn_{0.05}O_{3.03}$ | yes | - | - |
| Example 18 | $Ga_{1.70}Al_{0.30}O_{3.00}$ | yes | $Ga_{1.85}Al_{0.10}Sn_{0.05}O_{3.03}$ | yes | - | - |
| Example 19 | $Ga_{1.65}Al_{0.35}O_{3.00}$ | yes | $Ga_{1.85}Al_{0.10}Sn_{0.05}O_{3.03}$ | yes | - | - |
| Example 20 | $Ga_{1.60}Al_{0.40}O_{3.00}$ | yes | $Ga_{1.85}Al_{0.10}Sn_{0.05}O_{3.03}$ | yes | - | - |
| Example 21 | $Ga_{1.70}Al_{0.30}O_{3.00}$ | yes | $Ga_{1.85}Al_{0.10}Sn_{0.05}O_{3.03}$ | yes | - | - |
| Example 22 | $Ga_{1.50}Al_{0.50}O_{3.00}$ | yes | $Ga_{1.85}Al_{0.10}Sn_{0.05}O_{3.03}$ | yes | - | - |
| Example 23 | $Ga_{1.75}Al_{0.20}Hf_{0.04}Sn_{0.01}O_{3.03}$ | yes | $Ga_{1.85}Al_{0.10}Sn_{0.05}O_{3.03}$ | yes | $Zn_{1.80}Sn_{0.20}O_{2.20}$ | no |
| Example 24 | $Ga_{1.75}Al_{0.20}Hf_{0.04}Sn_{0.01}O_{3.03}$ | yes | $Ga_{1.85}Al_{0.10}Sn_{0.05}O_{3.03}$ | yes | $Zn_{1.80}Sn_{0.20}O_{2.20}$ | yes |
| Example 25 | $Ga_{1.60}Al_{0.40}O_{3.00}$ | yes | $Ga_{1.90}Al_{0.10}O_{3.00}$ | yes |  |  |
| Example 26 | $Ga_{1.60}Al_{0.40}O_{3.00}$ | yes | $Ga_{1.90}Al_{0.10}O_{3.00}$ | yes | $Zn_{1.80}Sn_{0.20}O_{2.20}$ | no |
| Comparative Example 1 | $Ga_{1.70}Al_{0.30}O_{3.00}$ | no | - | - | - | - |
| Comparative Example 2 | $Ga_{1.70}Al_{0.30}O_{3.00}$ | no | $Ga_2O_3$ | no | - | - |
| Comparative Example 3 | $Ga_2O_3$ | no | - | - | - | - |
| Comparative Example 4 | $Ga_{1.20}Zn_{0.80}O_{2.60}$ | no | - | - | - | - |

Fig. 11

|  | First n-type Layer | | | | | | Second n-type Layer | | | | Third n-type Layer | |
|---|---|---|---|---|---|---|---|---|---|---|---|---|
|  | Element | Composotion Change | Element | Composotion Change | Element | Composotion Change | Element | Composotion Change | Element | Composotion Change | Element | Composotion Change |
| Example 17 | Al | A | - | - | - | - | Al | A | Sn | J | - | - |
| Example 18 | Al | B | - | - | - | - | Al | B | - | - | - | - |
| Example 19 | Al | C | - | - | - | - | Al | C | - | - | - | - |
| Example 20 | Al | D | - | - | - | - | Al | D | - | - | - | - |
| Example 21 | Al | F | - | - | - | - | Al | A | - | - | - | - |
| Example 22 | Al | A | - | - | - | - | Al | A | - | - | - | - |
| Example 23 | Al | A | Hf | C | Sn | I | Al | A | Sn | G | - | - |
| Example 24 | Al | A | Hf | E | Sn | J | Al | A | Sn | H | Sn | H |
| Example 25 | Al | A | - | - | - | - | Al | A | - | - | - | - |
| Example 26 | Al | A | - | - | - | - | Al | A | - | - | - | - |

Fig. 12

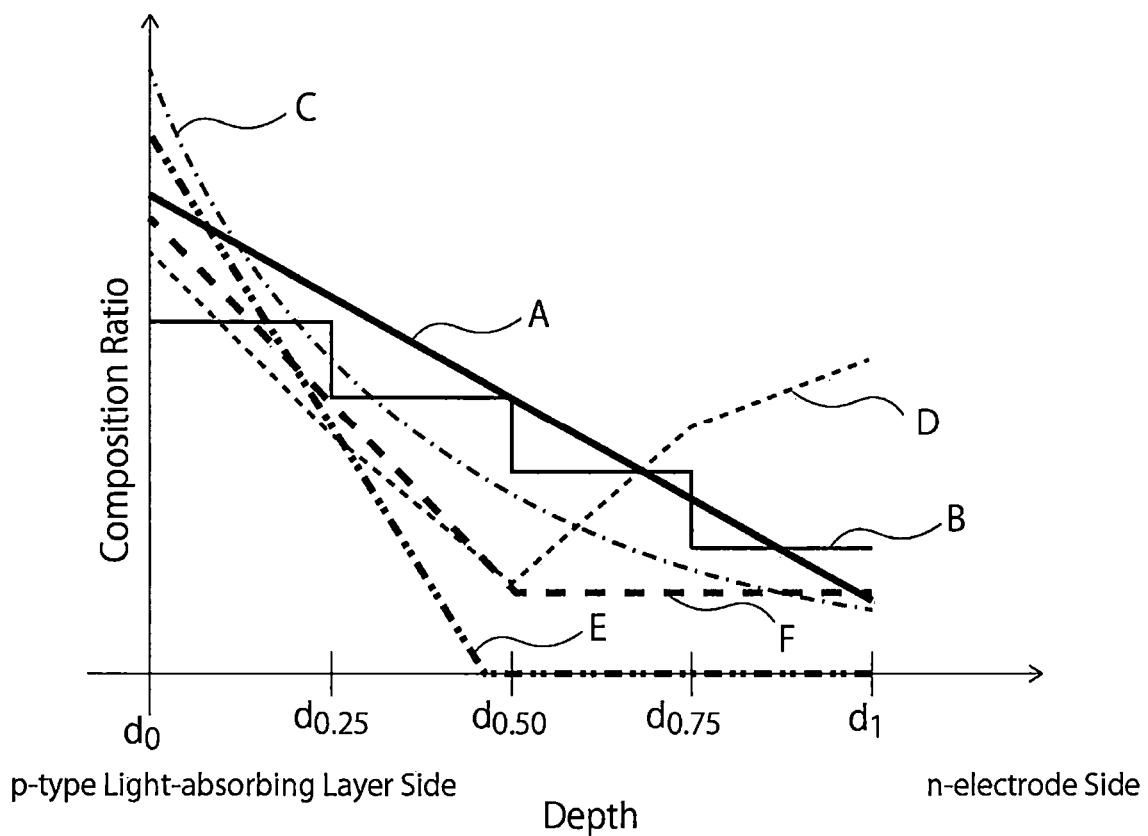

Fig. 13

|  | Transmittance | Jsc | VoC | FF | Conversion Efficiency |
|---|---|---|---|---|---|
| Example 1 | A | A | B | B | B |
| Example 2 | A | A | B | B | B |
| Example 3 | A | A | A | A | A |
| Example 4 | A | A | B | B | B |
| Example 5 | A | A | B | B | B |
| Example 6 | B | A | B | B | B |
| Example 7 | A | B | B | B | B |
| Example 8 | A | A | B | B | B |
| Example 9 | A | A | B | B | B |
| Example 10 | A | A | B | B | B |
| Example 11 | A | A | A | A | A |
| Example 12 | A | A | A | A | A |
| Example 13 | A | A | A | A | A |
| Example 14 | A | B | B | B | B |
| Example 15 | A | A | B | B | B |
| Example 16 | B | A | A | A | A |
| Example 17 | A | A | B | B | B |
| Example 18 | A | A | B | B | B |
| Example 19 | A | B | B | B | B |
| Example 20 | A | B | B | B | B |
| Example 21 | A | A | B | B | B |
| Example 22 | A | A | B | B | B |
| Example 23 | A | A | A | A | A |
| Example 24 | A | A | A | A | A |
| Example 25 | A | A | B | B | B |
| Example 26 | A | A | A | A | A |
| Comparative Example 1 | - | - | - | - | - |
| Comparative Example 2 | B | C | C | C | C |
| Comparative Example 3 | A | B | C | C | C |
| Comparative Example 4 | B | C | C | C | C |

Fig. 15

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Patent Application No. PCT/JP2020/38403, the International Filing Date of which is Oct. 9, 2020, the entire contents of which are incorporated herein by reference.

FIELD

Embodiments described herein relate generally to a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 11 is conceptual diagram of a flying object according to an embodiment.
FIG. 12 is a table related to n-type layers and n-electrodes of Examples.
FIG. 13 is a graphs of composition change modes of Examples.
FIG. 15 is a table related to Examples.

DETAILED DESCRIPTION

A solar cell of an embodiment includes a p-electrode; an n-electrode, a p-type light-absorbing layer located between the p-electrode and the n-electrode and mainly containing a cuprous oxide, and an n-type layer including a first n-type layer which is located between the p-type light-absorbing layer and the n-electrode and mainly contains a compound represented by $Ga_{x1}M1_{x2}M2_{x3}M3_{x4}O_{x5}$, the M1 being Al or/and B, the M2 being one or more selected from the group consisting of In, Ti, Zn, Hf, and Zr, the M3 being one or more selected from the group consisting of Sn, Si, and Ge, the x1 and the x5 being more than 0, the x2, the x3, and the x4 being 0 or more, and the x5 when a sum of the x1, the x2, the x3, and the x4 is 2 being 3.0 or more and 3.8 or less, and a second n-type layer which is located between the first n-type layer and the n-electrode and mainly contains a compound represented by $Ga_{y1}M1_{y2}M2_{y3}M3_{y4}O_{y5}$, the y1 and the y5 being more than 0, the y2, the y3, and the y4 being 0 or more, and the y5 when a sum of the y1, the y2, the y3, and the y4 is 2 being 3.0 or more and 3.8 or less, or a first n-type region which is located between the p-type light-absorbing layer and the n-electrode and mainly contains a compound represented by $Ga_{x1}M1_{x2}M2_{x3}M3_{x4}O_{x5}$, the M1 being Al or/and B, the M2 being one or more selected from the group consisting of In, Ti, Zn, Hf, and Zr, the M3 being one or more selected from the group consisting of Sn, Si, and Ge, the x1 and the x5 being more than 0, the x2, the x3, and the x4 being 0 or more, and the x5 when a sum of the x1, the x2, the x3, and the x4 is 2 being 3.0 or more and 3.8 or less, and a second n-type region which is located between the first n-type region and the n-electrode and mainly contains a compound represented by $Ga_{y1}M1_{y2}M2_{y3}M3_{y4}O_{y5}$, the y1 and the y5 being more than 0, the y2, the y3, and the y4 being 0 or more, and the y5 when a sum of the y1, the y2, the y3, and the y4 is 2 being 3.0 or more and 3.8 or less. (x2+x3) is larger than (y2+y3).

Hereinafter, an embodiment will be described in detail with reference to the drawings. Unless otherwise specified, values at 25° C. and 1 atm (atmosphere) are shown.

First Embodiment

Figure 1:
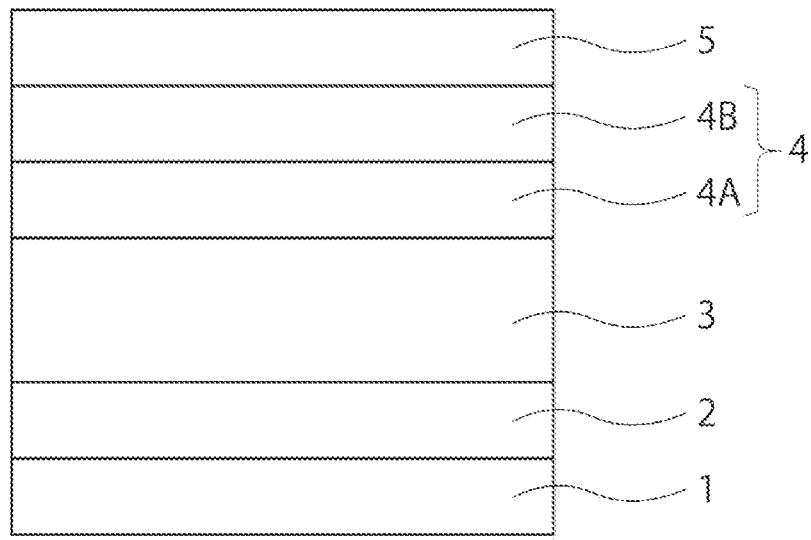
FIG. 1 is a cross-sectional view of a solar cell according to an embodiment.

A first embodiment relates to a solar cell. FIG. 1 illustrates a cross-sectional view of a solar cell 100 of the first embodiment. As illustrated in FIG. 1, the solar cell 100 according to the present embodiment includes a substrate 1, a p-electrode 2 as a first electrode, a p-type light-absorbing layer 3, an n-type layer 4, and an n-electrode 5 as a second electrode. In the first embodiment, the n-type layer 4 includes a first n-type layer 4A and a second n-type layer 4B. An intermediate layer which is not illustrated may be included between the first n-type layer 4 and the n-electrode 5. Sunlight may be incident from either the n-electrode 5 side or the p-electrode 2 side, but is more preferably incident from the n-electrode 5 side. Since the solar cell 100 of the embodiment is a transmissive solar cell, it is preferable that the solar cell is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the first n-type layer 4A side. Hereinafter, although a configuration illustrated in FIG. 1 will be described, a configuration in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the light-absorbing layer 3. It is preferable that the p-electrode 2 includes one or more layers of transparent conductive oxide films. The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more selected from the group consisting of In, Si, Ge, Ti, Cu, Sb, Nb, Ta, W, Mo, F, Cl, and the like. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 10 nm or less. The metal (including alloy) contained in the metal film is not particularly limited, and is Mo, Au, Cu, Ag, Al, Ta, W, or the like. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode 2, it is preferable that a film thickness is about 5 nm or less from the viewpoint of transparency. When the line-shaped or mesh-shaped metal film is used, since the transparency is secured at an opening, the film thickness of the metal film is not limited thereto.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is disposed between the p-electrode 2 and the first n-type layer 4A. The p-type light-absorbing layer 3 forms a p-n junction with the first n-type layer 4A. The p-type light-absorbing layer 3 is a semiconductor layer of a metal oxide containing Cu as a main component. The metal oxide containing Cu as the main component is a cuprous oxide or/and a complex oxide of cuprous oxides. 90 wt % or more of the p-type light-absorbing layer 3 is preferably a cuprous oxide or/and the complex oxide of cuprous oxides. 95 wt % or more of the p-type light-absorbing layer 3 is more preferably a cuprous oxide or/and a complex oxide of cuprous oxides. 98 wt % or more of the p-type light-absorbing layer 3 is still more preferably a cuprous oxide or/and a complex oxide of cuprous oxides. It is preferable that the p-type light-absorbing layer 3 hardly contains Cu or/and CuO which is a heterogeneous phase. Since the p-type light-absorbing layer 3 contains less heterogeneous phases and has good crystallinity, the transmittance of the p-type light-absorbing layer 3 is increased. In the metal oxide containing Cu as the main component, Cu is 60.0 atom % or more and 67.0 atom % or less, and oxygen (O) is 32.5 atom % or more and 34.0 atom % or less. The complex oxide of cuprous oxides contains metal other than Cu. The metal contained in the complex oxide of cuprous oxides is one or more metals selected from the group consisting of Sn, Sb, Ag, Li, Na, K, Cs, Rb, Al, Ga, In, Zn, Mg, and Ca in addition to Cu. When one or more metals selected from the group consisting of Ag, Li, Na, K, Cs, Rb, Al, Ga, In, Zn, Mg, and Ca are contained in addition to Cu, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. The p-type light-absorbing layer 3 may further contain Sn or Sb. Sn or Sb in the p-type light-absorbing layer 3 may be added to the light-absorbing layer 3 or may be derived from the p-electrode 2. The p-type light-absorbing layer 3 is a layer of an oxide represented by $Cu_aM_bO_c$. M is one or more metals selected from the group consisting of Sn, Sb, Ag, Li, Na, K, Cs, Rb, Al, Ga, In, Zn, Mg, and Ca. a, b, and c preferably satisfy $1.80 \leq a \leq 2.01$, $0.00 \leq b \leq 0.20$, and $0.98 \leq c \leq 1.02$. A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3. When concentrations of Sn and Sb in the p-type light-absorbing layer 3 are high, defects increase, and carrier recombination increases. Thus, a total volume concentration of Sb and Sn in the p-type light-absorbing layer 3 is preferably $1.5 \times 10^{19}$ atoms/cm³ or less. Compositions of the p-type light-absorbing layer 3 and the first n-type layer 4A are obtained by secondary ion mass spectrometry (SIMS). As an analysis position, an average value of values obtained in the same manner as the p-electrode 2 can be used as each layer composition.

A thickness of the p-type light-absorbing layer 3 is obtained by cross-sectional observation with an electron microscope or a step profiler, and is preferably 1,000 nm or more and 10,000 nm or less.

The p-type light-absorbing layer 3 is preferably formed by, for example, sputtering.

The n-type layer 4 includes the first n-type layer 4A and the second n-type layer 4B.

The first n-type layer 4A is an n-type semiconductor layer. The first n-type layer 4A is located between the p-type light-absorbing layer 3 and the second n-type layer 4B. The second n-type layer 4B is located between the first n-type layer 4A and the n-electrode 5. The first n-type layer 4A is in direct contact with a surface of the p-type light-absorbing layer 3 opposite to a surface in contact with the p-electrode 2. The first n-type layer 4A is an oxide semiconductor layer containing Ga and preferably contains a compound having Ga as a base. It is preferable that the first n-type layer 4A is an oxide semiconductor layer containing Ga and contains a compound having Ga as a base. In the first n-type layer 4A, an oxide having Ga as a base may be mixed with another oxide, an oxide having Ga as a base may be doped with another element, or an oxide having Ga as a base and doped with another element may be mixed with another oxide.

It is preferable that the first n-type layer 4A is a layer that mainly contains (50 wt % or more of) a compound represented by $Ga_{x1}M1_{x2}M2_{x3}M3_{x4}O_{x5}$, the M1 is Al or/and B, the M2 is one or more selected from the group consisting of In, Ti, Zn, Hf, and Zr, and the M3 is one or more selected from the group consisting of Sn, Si, and Ge. The x1, the x2 and the x5 are more than 0. The x3 and the x4 are 0 or more. When the sum of the x1, the x2, the x3, and the x4 is 2, it is preferable that the x5 is 3.0 or more and 3.8 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{x1}M1_{x2}M2_{x3}M3_{x4}O_{x5}$.

Figure 2:
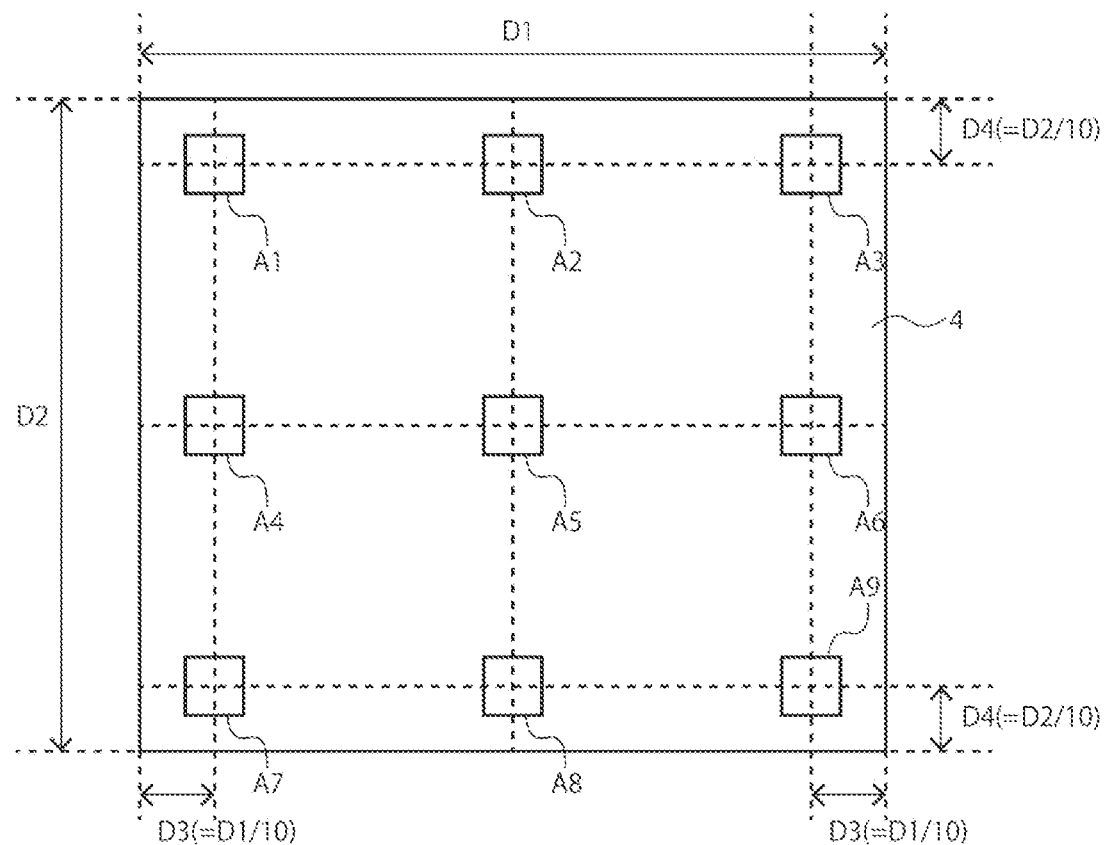
FIG. 2 is a diagram illustrating analysis spots of a solar cell according to an embodiment.

90 wt % or more of the first n-type layer 4A is preferably a compound represented by $Ga_{x1}M1_{x2}M2_{x3}M3_{x4}O_{x5}$. 95 wt % or more of the first n-type layer 4A is more preferably a compound represented by $Ga_{x1}M1_{x2}M2_{x3}M3_{x4}O_{x5}$. 98 wt % or more of the first n-type layer 4A is still more preferably a compound represented by $Ga_{x1}M1_{x2}M2_{x3}M3_{x4}O_{x5}$. The first n-type layer 4A more preferably consists of a compound represented by $Ga_{x1}M1_{x2}M2_{x3}M3_{x4}O_{x5}$ A composition of the compound of the first n-type layer 4A is an average composition of the entire first n-type layer 4A unless otherwise specified. When a thickness of the first n-type layer 4A is d, the composition of the first n-type layer 4A is an average value of the compositions at depths of 0.2d, 0.5d, and 0.8d from a surface of the first n-type layer 4A on the p-type light-absorbing layer 3 side. Unless there is a condition that an elemental composition ratio of the compound of the first n-type layer 4A is inclined, the first n-type layer 4A preferably satisfies the above compositions and the following suitable compositions at each depth. When the first n-type layer 4A is very thin (for example, 5 nm or less), the composition at a depth of 0.5d from the surface of the first n-type layer 4A on the p-type light-absorbing layer 3 side can be regarded as the composition of the entire first n-type layer 4A. In the analysis, analysis spots distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the first n-type layer 4A in a width direction, and D2 is a length of the first n-type layer 4A in a depth direction.

The first n-type layer 4A which reduces the difference between the conduction band minimum (CBM) of the p-type light-absorbing layer 3 and the conduction band minimum of the first n-type layer 4A is preferable. The element of M1 is contained in the compound of the first n-type layer 4A in order to reduce the difference in the conduction band minimum because the conduction band minimum of $Ga_2O_3$ is very low compared with the p-type light-absorbing layer 3. The difference between the conduction band minimum of the p-type light-absorbing layer 3 and the conduction band minimum of the first n-type layer 4A ([conduction band minimum of p-type light-absorbing layer 3]−[conduction band minimum of first n-type layer 4A]) is preferably 0.0 eV or more and 0.4 eV or less.

The conduction band minimum of the first n-type layer 4A of the embodiment is adjusted mainly by the elements of Ga and M1. An element ratio of the M1 is increased, and thus, the conduction band minimum of the first n-type layer 4A increases. The difference in the conduction band minimum of the p-type light-absorbing layer 3 can be reduced. According to the same viewpoint, in the first n-type layer 4A, $(x1+x2)/(x1+x2+x3+x4)$ is preferably 0.80 or more and 1.00 or less, and more preferably 0.90 or more and 1.00 or less. As the element of M1, Al or Al and B are preferable, and Al is more preferable. Since conversion efficiency is improved by using an oxide having the elements of Ga and M1 as a base for the first n-type layer 4A, it is preferable that the x2 is larger than the x3 and larger than the x4. According to the same viewpoint, the x2 is preferably larger than twice of the x3 and larger than twice of the x4.

$x2/(x1+x2)$ is preferably 0.00 or more and 0.50 or less. When $x2/(x1+x2)$ is larger than 0.50, it is difficult to obtain a solar cell having high conversion efficiency because a spike in which a conduction band at a p-n junction interface becomes discontinuous occurs and FF decreases. $x2/(x1+x2)$ is more preferably 0.00 or more and 0.40 or less, and more preferably 0.10 or more and 0.35 or less.

The compound of the first n-type layer 4A can contain one or more selected from the group consisting of In, Ti, Zn, Hg, and Zr represented by M2. $x3/(x1+x2+x3+x4)$ is preferably 0.00 or more and 0.50 or less. The element of M2 can adjust the conduction band minimum of the first n-type layer 4A. When the element of M2 is too large, the difference between the conduction band minimum of the first n-type layer 4A and the p-type light-absorbing layer 3. Thus, $x3/(x1+x2+x3+x4)$ is more preferably 0.00 or more and 0.10 or less, and more preferably 0.00 or more and 0.05 or less.

The compound of the first n-type layer 4A can contain one or more selected from the group consisting of Sn, Si, and Ge represented by M3. When the element of M3 is contained in the first n-type layer 4A, a carrier concentration of the first n-type layer 4A can be increased. $x4/(x1+x2+x3+x4)$ is 0.00 or more and 0.15 or less, and more preferably 0.00 or more and 0.10 or less. It is preferable that x4 is less than $(x2+x3)$.

One or more selected from the group consisting of the elements of Ga, the element of M1, the element of M2, and the element of M3 may have a composition ratio changing in the first n-type layer 4B in a film thickness direction of the first n-type layer 4B. It is preferable that the element of M3 is small on the p-type light-absorbing layer 3 side and is large on the second n-type layer 4B side. It is preferable that the element of M1 is large on the p-type light-absorbing layer 3 side and is small on the second n-type layer 4B side. It is preferable that the change of the composition is an inclined change, a stepwise change, or a combination of the inclined change and the stepwise change. The change of the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

When a thickness of the first n-type layer 4A is $d_{4A}$, it is preferable that an element ratio of the M1 in a region $d_{40-0.25}$ from a surface of the first n-type layer 4A on the p-type light-absorbing layer 3 side to a depth of $0.25d_{4A}$ toward the second n-type layer 4B is 1.10 times (1.10 times of the x2 (the average of the first n-type layer 4A) (the same applies hereinafter)) or more and 2.50 times (2.50 times of the x2 (the average of the first n-type layer 4A) (the same applies hereinafter)) or less of the x2. It is preferable that an element ratio of the M1 in a region $d_{A0.25-0.50}$ from the depth of $0.25d_{4A}$ from the surface of the first n-type layer 4A on the p-type light-absorbing layer 3 side toward the second n-type layer 4B to a depth of $0.50d_{4A}$ toward the second n-type layer 4B is 0.75 times or more and 1.50 times or less of the x2. It is preferable that an element ratio of the M1 in a region $d_{A0.50-0.75}$ from the depth of $0.50d_{4A}$ from the surface of the first n-type layer 4A on the p-type light-absorbing layer 3 side toward the second n-type layer 4B to a depth of $0.75d_{4A}$ toward the second n-type layer 4B is 0.30 times or more and 1.50 times or less of the x2. It is preferable that an element ratio of the M1 in a region $d_{A0.75-1}$ from the depth of $0.75d_{4A}$ from the surface of the first n-type layer on the p-type light-absorbing layer 3 side toward the second n-type layer 4B to a depth of $1.00d_{4A}$ toward the second n-type layer 4B is 0.10 times or more and 0.90 times or less of the x2. When the composition is changed, it is preferable that the composition ratio changing in the n-type layer is in one direction in view of the continuity of the connection of the conduction band minimum. Specifically, it is preferable that the element ratio of the M1 in the region $d_{A0-0.25}$ is equal to or more of the element ratio of the M1 in the region $d_{A0.25-0.50}$. It is preferable that the element ratio of the M1 in the region $d_{A0.25-0.50}$ is equal to or more of the element ratio of the M1 in the region $d_{A0.50-0.75}$. It is preferable that the element ratio of the M1 in the region $d_{A0.50-0.75}$ is equal to or more of the element ratio of the M1 in the region $d_{A0.75-1}$. According to the same viewpoint, it is preferable that the element ratio of the M1 in the region $d_{A0.75-1}$ is equal to half or less of the element ratio of the M1 in the region $d_{A0-0.25}$. When the composition of M1 is changed, as described above, it is preferable that x2/(x1+x2) in the region $d_{A0-0.25}$ and x2/(x1+x2) in the region $d_{A0.25-0.50}$ are 0.10 or more and 0.40, and more preferably 0.10 or more and 0.35 or less.

When the composition change of Ga is large, the composition of the elements other than Ga is greatly changed, and the continuity of the connection of the conduction band minimum decreases. Therefore, when the composition of Ga is changed, it is preferable that the changing rate is smaller than the changing rate of the element of M1. When a thickness of the first n-type layer 4A is $d_{4A}$, it is preferable that an element ratio of Ga of the region $d_{A0-0.25}$ from the surface of the first n-type layer 4A on the p-type light-absorbing layer 3 side to the depth of $0.25d_{4A}$ toward the second n-type layer 4B is 0.75 times (0.75 times of the x1 (the average of the first n-type layer 4A) (the same applies hereinafter)) or more and 0.98 times (0.98 times of the x1 (the average of the first n-type layer 4A) (the same applies hereinafter)) or less of the x1. It is preferable that an element ratio of Ga of the region $d_{A0.25-0.50}$ from the depth of $0.25d_{4A}$ from the surface of the first n-type layer 4A on the p-type light-absorbing layer 3 side toward the second n-type layer 4B to a depth of $0.50d_{4A}$ toward the second n-type layer 4B is 0.80 times or more and 1.10 times or less of the x1. It is preferable that an element ratio of Ga of the region $d_{A0.50-0.75}$ from the depth of $0.50d_{4A}$ from the surface of the first n-type layer 4A on the p-type light-absorbing layer 3 side toward the second n-type layer 4B to a depth of $0.75d_{4A}$ toward the second n-type layer 4B is 0.90 times or more and 1.20 times or less of the x1. It is preferable that an element ratio of Ga of the region $d_{A0.75-1}$ from the depth of $0.75d_{4A}$ from the surface of the first n-type layer 4A on the p-type light-absorbing layer 3 side toward the second n-type layer 4B to a depth of $1.00d_{4A}$ toward the second n-type layer 4B is 1.02 times or more and 1.25 times or less of the x1. When the composition is changed, it is preferable that the composition ratio changing in the n-type layer is in one direction in view of the continuity of the connection of the conduction band minimum. Specifically, it is preferable that the element ratio of Ga in the region $d_{A0-0.25}$ is equal to or less of the element ratio of Ga in the region $d_{A0.25-0.50}$. It is preferable that the element ratio of Ga in the region $d_{A0.25-0.50}$ is equal to or less of the element ratio of Ga in the region $d_{A0.50-0.75}$. It is preferable that the element ratio of the M1 in the region $d_{A0.50-0.75}$ is equal to or less of the element ratio of Ga in the region $d_{A0.75-1}$.

The first n-type layer 4A is preferably formed by, for example, sputtering, atomic layer deposition (ALD), or the like.

The second n-type layer 4B is located between the first n-type layer 4A and the n-electrode 5. A surface of the second n-type layer 4B on the first n-type layer 4A side is in direct contact with the first n-type layer 4A. The second n-type layer 4B is an oxide semiconductor layer containing Ga and preferably contains a compound having Ga as a base. An interface between the first n-type layer 4A and the second n-type layer 4B may be clear or unclear. In the second n-type layer 4B an oxide having Ga as a base may be mixed with another oxide, an oxide having Ga as a base may be doped with another element, or an oxide having Ga as a base and doped with another element may be mixed with another oxide. An intermediate layer which is not illustrated) can be provided between the second n-type layer 4B and the n-electrode 5.

It is preferable that the second n-type layer 4B is a layer that mainly contains (50 wt % or more of) a compound represented by $Ga_{y1}M1_{y2}M2_{y3}M3_{y4}O_{y5}$ the M1 is Al or/and B, the M2 is one or more selected from the group consisting of In, Ti, Zn, Hf, and Zr, and the M3 is one or more selected from the group consisting of Sn, Si, and Ge. The y1 and the y5 is more than 0. The y2, the y3, and the y4 is 0 or more. When a sum of the y1, the y2, the y3, and the y4 is 2, it is preferable that the y5 is 3.0 or more and 3.8 or less. All configurations of a mode in which an oxide having Ga or/and Zn as a base is mixed with another oxide, a mode in which an oxide having Ga or/and Zn as a base is doped with another element, and a mode in which an oxide having Ga or/and Zn doped with another element as a base is mixed with another oxide are represented by $Ga_{y1}M1_{y2}M2_{y3}M3_{y4}O_{y5}$.

In consideration of improving continuity of connection of the conduction band minimum, (x2+x3) is preferably more than (y2+y3). According to the same viewpoint, (y2+y3) is preferably 0.8 times or less of (x2+x3), more preferably 0.5 times or less of (x2+x3), still more preferably 0.3 times or less of (x2+x3).

90 wt % or more of the second n-type layer 4B is preferably a compound represented by $Ga_{y1}M1_{y2}M2_{y3}M3_{y4}O_{y5}$. 95 wt % or more of the second n-type layer 4B is more preferably a compound represented by $Ga_{w1}M2_{w2}M3_{w3}M4_{w4}O_{w5}$. 98 wt % or more of the second n-type layer 4B is still more preferably a compound represented by $Ga_{y1}M1_{y2}M2_{y3}M3_{y4}O_{y5}$. The second n-type layer 4B more preferably consists of a compound represented by $Ga_{y1}M1_{y2}M2_{y3}M3_{y4}O_{y5}$.

The conduction band minimum of the second n-type layer 4B is adjusted by mainly by Ga and the element of M1. The conduction band minimum is decreased than that of the first n-type layer 4A so that the element ratio of the M1 of the second n-type layer 4B is smaller than that of the first n-type layer 2B and the element ratio of Ga in the second n-type layer 2B is larger than that of the first n-type layer 4A. As the result, the continuity of the connection of the conduction band minimum from the first n-type layer 4A to n-electrode 5 is improved. (y1+y2)/(y1+y2+y3+y4) is preferably 0.65 or more and 1.00 or less in the second n-type layer 4B. According to the same viewpoint, (y1+y2)/(y1+y2+y3+y4) is preferably 0.80 or more and 1.00 or less, more preferably 0.90 or more and 1.00 or less in the second n-type layer 4B.

The second n-type layer 4B is a layer having the conduction band minimum which is lower than the conduction band minimum of the first n-type layer 4A. The conduction band minimum of the second n-type layer 4B is between the conduction band minimum of the first n-type layer 4A and the n-electrode 5. By using the second n-type layer 4B, the conduction band minimum from the first n-type layer 4A to n-electrode 5 is continuously connected, FF and Voc are improved, and it contributes improving the conversion efficiency. When the y2 is more than 0, the second n-type layer 4B includes the element of M1 which is included in the first n-type layer 4A. Therefore, when Al is included in the first n-type layer, it is preferable that Al is included in the second n-type layer 4B rather than Al is not included. Additionally, the conduction band minimum of the second n-type layer 4B is smaller than the conduction band minimum of the first n-type layer 4A and the continuity of the connection of the conduction band minimum is improved because the y1 is more than the x1 and the y2 and the y1 is less than the x2. According to the same viewpoint, y2/(y1+y2) is preferably 0.00 or more and 0.30 or less, more preferably 0.00 or more and 0.20 or less. When the x2 is close to the y2, improving the continuity of the connection of the conduction band minimum is decreased by using the second n-type layer. Therefore, the y2 is preferably 90% or less of the x2, more preferably 80% or less of the x2, more preferably 70% or less of the x2.

The y3 is preferably the x3 or the x4 on the first embodiment. Therefore, y3/(y1+y2+y3+y4) is more preferably 0.00 or more and 0.10 or less, more preferably 0.00 or more 0.05 or less.

y4/(y1+y2+y3+y4) is preferably 0.00 or more and 0.15 or less. When the element M3 is included, it is preferable that the carrier concentration of the second n-type layer 4B becomes large. It is preferable that the carrier concentration of the second n-type layer 4B is larger than that of the first n-type layer 4A (y4 is larger than x4). Therefore, y4/(y1+y2+y3+y4) is preferably 0.01 or more and 0.15 or less, more preferably 0.05 or more and 0.15 or less.

The sum of a film thickness of the first n-type layer 4A and a film thickness of the second n-type layer 4B is typically 3 nm or more and 100 nm or less. When the sum of the film thickness of the first n-type layer 4A and the film thickness of the second n-type layer 4B is less than 3 nm, a leakage current may be generated in a case where coverage of the first n-type layer 4A and the second n-type layer 4B is poor, and characteristics may be deteriorated. When the coverage is good, the film thickness is not limited to the above film thickness. When the sum of the film thickness of the first n-type layer 4A and the film thickness of the second n-type layer 4B exceeds 50 nm, characteristics may be deteriorated due to an excessive increase in resistance of the n-type layer including the first n-type layer 4A and the second n-type layer 4B, or a short-circuit current may be reduced due to a decrease in transmittance. Accordingly, the sum of the film thickness of the first n-type layer 4A and the film thickness of the second n-type layer 4B is more preferably 3 nm or more and 30 nm or less, still more preferably 5 nm or more and 30 nm or less.

One or more selected from the group consisting of the elements of Ga, the element of M1, the element of M2, and the element of M3 may have a composition ratio changing in the second n-type layer 4B in a film thickness direction of the second n-type layer 4B. It is preferable that the element of M3 is small on the p-type light-absorbing layer 3 side and is large on the second n-type layer 4B side. It is preferable that the element of M1 is large on the p-type light-absorbing layer 3 side and is small on the second n-type layer 4B side. It is preferable that the change of the composition is an inclined change, a stepwise change, or a combination of the inclined change and the stepwise change. The change of the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

When a thickness of the second n-type layer 4B is $d_{4B}$, it is preferable that an element ratio of the M1 in a region $d_{B0-0.25}$ from a surface of the second n-type layer 4B on the first n-type layer 4A side to a depth of $0.25d_{4B}$ toward the n-electrode 5 is 1.10 times of y2 (1.10 times of the y2 (the average of the second n-type layer 4B) (the same applies hereinafter)) or more and 4.00 times of y2 (4.00 times of the y2 (the average of the second n-type layer 4B) (the same applies hereinafter)) or less. It is preferable that an element ratio of the M1 in a region $d_{B0.25-0.50}$ from the depth of $0.25d_{4B}$ from the surface of the second n-type layer 4B on the first n-type layer 4A side toward the n-electrode 5 to a depth of $0.50d_{4B}$ toward the n-electrode 5 is 0.00 times or more and 1.50 times of the y2 or less. It is preferable that an element ratio of the M1 in a region $d_{B0.50-0.75}$ from the depth of $0.50d_{4B}$ from the surface of the second n-type layer 4B on the first n-type layer 4A side toward the n-electrode 5 to a depth of $0.75d_{4B}$ toward the n-electrode 5 is 0.00 times or more and 1.25 times of the y2 or less. It is preferable that an element ratio of the M1 in a region $d_{B0.75-1}$ from the depth of $0.75d_{4B}$ from the surface of the second n-type layer 4B on the first n-type layer 4A side toward the n-electrode 5 to a depth of $1.00d_{4B}$ toward the n-electrode 5 is 0.00 times or more and 0.90 times or less of the y2. When the composition is changed, it is preferable that the composition ratio changing in the n-type layer 4 is in one direction in view of the continuity of the connection of the conduction band minimum. Specifically, it is preferable that the element ratio of the M1 of the region $d_{B0-0.25}$ is equal to the element ratio of the M1 of the region $d_{B0.25-0.50}$ or more. It is preferable that the element ratio of the M1 of the region $d_{B0.25-0.50}$ is equal to the element ratio of the M1 of the region $d_{B0.50-0.75}$ or more. It is preferable that the element ratio of the M1 of the region $d_{B0.50-0.75}$ is equal to the element ratio of the M1 of the region $d_{B0.75-1}$ or more. According to the same viewpoint, it is preferable that the element ratio of the M1 of the region $d_{B0.75-1}$ is equal to half or less of the element ratio of the M1 of the region $d_{A0-0.25}$.

When the thickness of the second n-type layer 4B is $d_{4B}$, the element ratio of the M3 in a region $d_{B0-0.25}$ from a surface of the second n-type layer 4B on the first n-type layer 4A side to a depth of $0.25d_{4B}$ toward the n-electrode 5 is 0.00 times or more and 0.75 times or less of the y4. It is preferable that an element ratio of the M3 in a region $d_{B0.25-0.50}$ from the depth of $0.25d_{4B}$ from the surface of the second n-type layer 4B on the first n-type layer 4A side toward the n-electrode 5 to a depth of $0.50d_{4B}$ toward the n-electrode 5 is 0.30 times or more and 1.50 times or less of the y4. It is preferable that the element ratio of the M3 in a region $d_{B0.50-0.75}$ from the depth of $0.50d_{4B}$ from the surface of the second n-type layer 4B on the first n-type layer 4A side toward the n-electrode 5 to a depth of $0.75d_{4B}$ toward the n-electrode 5 is 0.75 times or more and 2.00 times or less of the y4. It is preferable that the element ratio of the M3 in a region $d_{B0.75-1}$ from the depth of $0.75d_{4B}$ from the surface of the second n-type layer 4B on the first n-type layer 5 side toward the n-electrode 5 to a depth of $1.00d_{4B}$ toward the n-electrode 5 is 1.10 times or more and 3.00 times or less of the y4. When the composition is changed, it is preferable that the composition ratio changing in the n-type layer 4 is in one direction in view of the continuity of the connection of the conduction band minimum. Specifically, it is preferable that the element ratio of the M3 of the region $d_{B0-0.25}$ is equal to the element ratio of the M1 of the region $d_{B0.25-0.50}$ or less. It is preferable that the element ratio of the M3 of the region $d_{B0.25-0.50}$ is equal to the element ratio of the M1 of the region $d_{B0.50-0.75}$ or less. It is preferable that the element ratio of the M3 of the region $d_{B0.50-0.75}$ is equal to the element ratio of the M1 of the region $d_{B0.75-1}$ or less. According to the same viewpoint, it is preferable that the element ratio of the M3 of the region $d_{B0-0.25}$ is equal to half or less of the element ratio of the M1 of the region $d_{A0.75-1}$.

The n-electrode 5 is an electrode on the first n-type layer 4A side having transparency to visible light. The first n-type layer 4A is sandwiched between the n-electrode 5 and the p-type light-absorbing layer 3. An intermediate layer which is not illustrated can be provided between the first n-type layer 4A and the n-electrode 5. The intermediate layer can include a mesh-shaped or line-shaped electrode. It is preferable that a transparent conductive oxide film is used for the n-electrode 5. It is preferable that the transparent conductive oxide film used for the n-electrode 5 is one or more transparent conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. Graphene may be used for the n-electrode 5. It is preferable that graphene is stacked with Ag nano wires.

A thickness of the n-electrode 5 is obtained by cross-sectional observation with an electron microscope or a step profiler, and is not particularly limited, but is typically 1 nm or more and 2 μm or less.

It is preferable that the n-electrode 5 is formed by, for example, sputtering.

Second Embodiment

Figure 3:
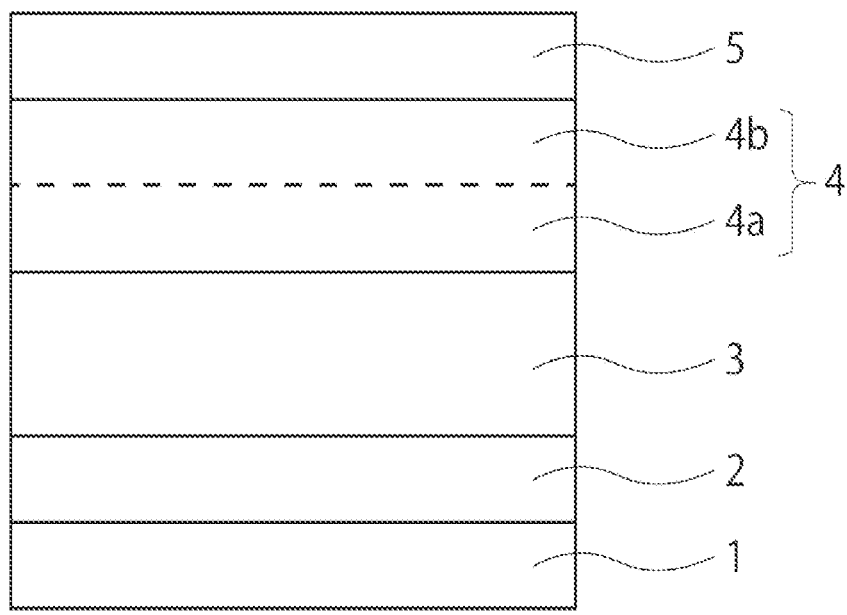
FIG. 3 is a cross-sectional view of a solar cell according to an embodiment.

A second embodiment relates to a solar cell. FIG. 3 is a schematic cross-sectional view of a solar cell 101 according to the second embodiment. The solar cell 101 of the second embodiment has a difference from the solar cell 100 of the first embodiment in that the n-type layer 4 has a first region 4a and a second region 4b. Description common to the first embodiment and the second embodiment will be omitted.

The first region 4a is located on the first n-type layer 4A side of the p-type light-absorbing layer 3. The second region 4b is located on the n-electrode 5 side of the first n-type layer 4A. Although the composition of the p-type light-absorbing layer 3 side and the n-electrode 5 of the first n-type layer 4A of the third embodiment is clearly different, an interface between the first region 4a and the second region 4b is not confirmed. A region from a surface of the first n-type layer 4A on the p-type light-absorbing layer 3 side toward the n-electrode 5 side up to half a thickness of the first n-type layer 4A is defined as the first region 4a. A region from a surface of the first n-type layer 4A on the n-electrode 5 side toward the p-type light-absorbing layer 3 side up to half a thickness of the first n-type layer 4A is defined as the second region 4b. As in the first embodiment, in the analysis, analysis spots distributed as evenly as possible at equal intervals as represented in analysis spots of FIG. 2 at each distance from the surface of the n-type layer are analyzed by, for example, SIMS.

A relationship between the element ratio of the first region 4a and the second region 4b of the second embodiment and a relationship between the first n-type layer 4A and the first n-type layer 4B of the second embodiment corresponds to the composition ratio of elements. Accordingly, an inclined compositional change and the like described in the first embodiment are the same in the solar cell 101 and the like of the second embodiment.

Similarly to the solar cell 100 of the first embodiment, the solar cell 101 of the second embodiment also has excellent continuity of the connection at the conduction band minimum, Jsc, Voc, and FF are improved, and it contributes improving the conversion efficiency.

Third Embodiment

Figure 4:
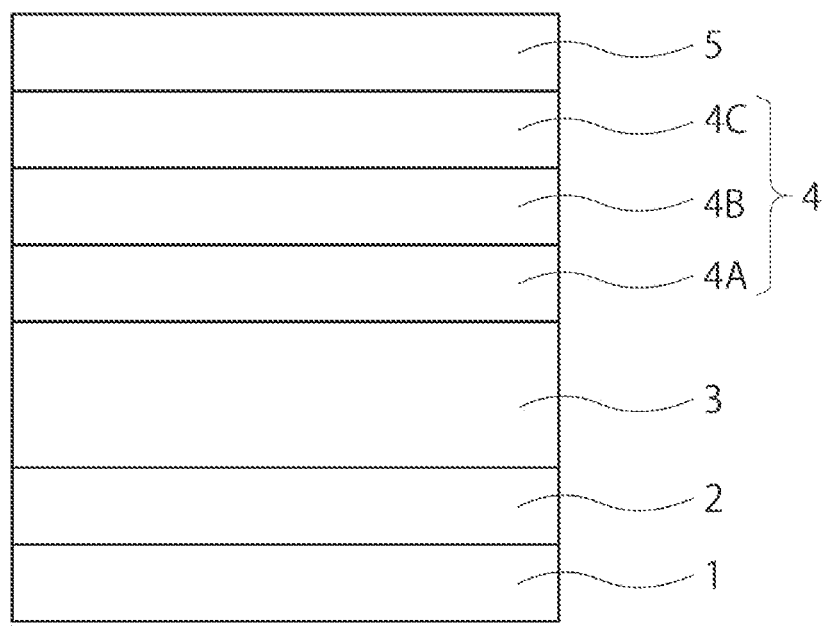
FIG. 4 is a cross-sectional view of a solar cell according to an embodiment.

A third embodiment relates to a solar cell. FIG. 4 is a schematic cross-sectional view of a solar cell 102 according to the third embodiment. The solar cell 102 of the third embodiment has a difference from the solar cell 101 of the second embodiment in that the solar cell 102 of the third embodiment includes an n-type layer 4 in which the first n-type layer 4A, the second n-type layer 4B, and a third n-type layer 4C are laminated, and so forth. Description common to the first embodiment to the third embodiment will be omitted.

The third n-type layer 4C is located between the second n-type layer 4B and the n-electrode 5. A surface of the third n-type layer 4C on the second n-type layer 4B side is in direct contact with the second n-type layer 4B. The third n-type layer 4C is an oxide semiconductor layer containing Ga or/and Zn and preferably contains a compound having Ga or/and Zn as a base. An interface between the second n-type layer 4B and the third n-type layer 4C may be clear or unclear. In the third n-type layer 4C, an oxide having Ga or/and Zn as a base may be mixed with another oxide, an oxide having Ga or/and Zn as a base may be doped with another element, or an oxide having Ga or/and Zn as a base and doped with another element may be mixed with another oxide. An intermediate layer which is not illustrated can be provided between the third n-type layer 4C and the n-electrode 5.

It is preferable that the third n-type layer 4C is a layer that mainly contains (50 wt % or more of) a compound represented by $Ga_{z1}Zn_{z2}Sn_{z3}M4_{z4}O_{z5}$, and the M4 is one or more selected from the group consisting of Hf, Zr, In, Ti, Al, B, Mg, Si, and Ge. The z1, the z2 and the z4 are 0 or more. The x3 is 0 or more. When the sum of the z1, the z2, the z3, and the z4 is 2, it is preferable that the z5 is 2.2 or more and 3.6 or less. All configurations of an oxide having Ga or/and Zn as a base is mixed with another oxide, an oxide having Ga or/and Zn as a base is doped with another element, and an oxide having Ga or/and Zn doped with another element as a base is mixed with another oxide are represented by $Ga_{z1}Zn_{z2}Sn_{z3}M4_{z4}O_{z5}$.

90 wt % or more of the third n-type layer 4C is preferably a compound represented by $Ga_{z1}Zn_{z2}Sn_{z3}M4_{z4}O_{z5}$. 95 wt % or more of the third n-type layer 4C is more preferably a compound represented by $Ga_{z1}Zn_{z2}Sn_{z3}M4_{z4}O_{z5}$. 98 wt % or more of the third n-type layer 4C is still more preferably a compound represented by $Ga_{z1}Zn_{z2}Sn_{z3}M4_{z4}O_{z5}$. The third n-type layer 4C more preferably consists of a compound represented by $Ga_{z1}Zn_{z2}Sn_{z3}M4_{z4}O_{z5}$.

The conduction band minimum of the third n-type layer 4C is adjusted by mainly by Ga, Zn and Sn so as to reduce a difference from the conduction band minimum of the second n-type layer 4B and a difference from the conduction band minimum of the n-electrode 5. The third n-type layer 4C can have a smaller difference from the conduction band minimum of the n-electrode 5 than $Ga_2O_3$ because the conduction band minimum of ZnO and $SnO_2$ is smaller than the conduction band minimum of $Ga_2O_3$. The conduction band minimum of the third n-type layer 4C becomes smaller than that of the first n-type layer 4A because the element ratio of Zn and Sn makes larger than the element ratio of Zn and Sn of the first n-type layer 4A and the second n-type layer 4C. Thus, the continuity of the connection of the conduction band minimum from the first n-type layer 4A to n-electrode 5 is improved. $(z1+z2)/(z1+z2+z3+z4)$ is preferably 0.60 or more and 0.98 or less in the third n-type layer 4C. According to the same viewpoint, $(z1+z2)/(z1+z2+z3+z4)$ is preferably 0.65 or more and 0.95 or less, and more preferably 0.70 or more and 0.90 or less in the third n-type layer 4C.

The third n-type layer 4C is located closest to the n-electrode 5 side in the n-type layer 4, and preferably, the third n-type layer 4C is in direct contact with the n-electrode 5. When Zn or Sn is contained in the first n-type layer 4A and the second n-type layer 4B, the composition ratio thereof is preferably lower than the concentrations of Zn and Sn in the third n-type layer 4C.

The third n-type layer 4C preferably contains Sn. When Sn is contained in the third n-type layer 4C, the continuity of the connection of the conduction band minimum is preferably improved, and a carrier concentration is preferably increased. Thus, $z3/(z1+z2+z3+z4)$ is preferably 0.10 or more and 0.50 or less, and more preferably 0.15 or more and 0.30 or less.

The element of M4 may or may not be contained in the third n-type layer 4C. When the element of M4 is contained, the composition ratio thereof is preferably low. Thus, $z4/(z1+z2+z3+z4)$ is preferably 0.00 or more and 0.05 or less. The element of M4 is preferably common to the elements contained in the second n-type layer 4B or the n-electrode 5.

In the third n-type layer 4C, Ga, Zn, Sn, and the element of M4 may change inclinedly, step-wisely, or a combination of the inclinedly step-wisely from the p-type light-absorbing layer 3 side toward the n-electrode 5. For example, Sn is preferably large on the n-electrode 5 side, and Ga and Zn are preferably large on the second n-type layer 4B side.

The sum of a film thickness of the first n-type layer 4A, a film thickness of the second n-type layer 4B, and a film thickness of the third n-type layer 4C is typically 3 nm or more and 100 nm or less. When the sum of the film thickness of the first n-type layer 4A, the film thickness of the second n-type layer 4B, and the film thickness of the third n-type layer 4C is less than 3 nm, a leakage current may be generated in a case where coverage of a film thickness of the first n-type layer 4A, a film thickness of the second n-type layer 4B, and a film thickness of the third n-type layer 4C is poor, and characteristics may be deteriorated. When the coverage is good, the film thickness is not limited to the above film thickness. When the sum of the film thickness of the first n-type layer 4A, the film thickness of the second n-type layer 4B, and the film thickness of the third n-type layer 4C exceeds 50 nm, characteristics may be deteriorated due to an excessive increase in resistance of the n-type layer 4 from the first n-type layer 4A to the third n-type layer 4C, or a short-circuit current may be reduced due to a decrease in transmittance. Accordingly, the sum of the film thickness of the first n-type layer 4A, the film thickness of the second n-type layer 4B, and the film thickness of the third n-type layer 4C is more preferably 3 nm or more and 30 nm or less, still more preferably 5 nm or more and 30 nm or less.

By using the third n-type layer 4C, the continuity of the connection of the conduction band minimum of the n-type layer 4 and the n-electrode 5. As the result, the solar cell 102 of the third embodiment also has excellent continuity of the connection at the conduction band minimum, Jsc, Voc, and FF are improved, and it contributes improving the conversion efficiency.

Fourth Embodiment

Figure 5:
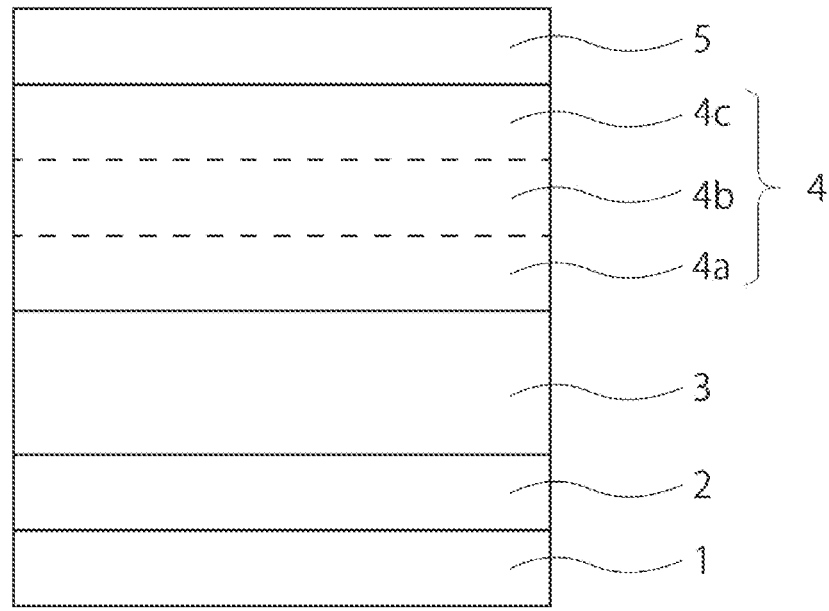
FIG. 5 is a cross-sectional view of a solar cell according to an embodiment.

A fourth embodiment relates to a solar cell. FIG. 5 is a schematic cross-sectional view of a solar cell 103 according to the fourth embodiment. The solar cell 103 of the fourth embodiment is different from the solar cell 102 of the second embodiment in that the n-type layer 4 has a first region 4a a second region 4b, and a third region 4c. Description common to the first embodiment to the third embodiment, and the fourth embodiment will be omitted. The third region 4c of the fourth embodiment corresponds to the third n-type layer 4C of the third embodiment.

The third region 4c is located on the n-electrode 5 side of the n-type layer 4. The second region 4b is located between the third region 4c and the first region 4a. Although the composition is significantly different on the p-type light-absorbing layer 3 side and the n-electrode 5 side in the first n-type layer 4A in the fifth embodiment, an interface between the first region 4a and the second region 4b is not confirmed. When a depth of the first n-type layer 4A is d, the first region 4a is from a surface of the first n-type layer 4A on the p-type light-absorbing layer 3 side toward the n-electrode 5 to a depth of 0.33d. The third region 4c is from a surface of the first n-type layer 4A on the n-electrode 5 side toward the p-type light-absorbing layer 3 to a depth of 0.33d toward the p-type light-absorbing layer 3. The second region 4b is located between the first region 4a and the third region 4c.

A composition of the compound of the first n-type region 4a is an average composition of the entire first n-type region 4a unless otherwise specified. When a thickness of the first n-type layer 4A is d, the composition of the first n-type region 4a is an average value of the compositions at depths of 0.10d, 0.20d, and 0.30d from a surface of the first n-type layer 4A on the p-type light-absorbing layer 3 side. When the first n-type layer 4A is very thin (for example, 10 nm or less), the composition at a depth of 0.2d from the surface of the first n-type layer 4A on the p-type light-absorbing layer 3 side is regarded as the composition of the entire first n-type region 4a. When a thickness of the first n-type layer 4A is d, the composition of the second n-type region 4b is an average value of the compositions at depths of 0.40d, 0.50d, and 0.60d from a surface of the first n-type layer 4A on the p-type light-absorbing layer 3 side. When the first n-type layer 4A is very thin (for example, 10 nm or less), the composition at a depth of 0.5d from the surface of the first n-type layer 4A on the p-type light-absorbing layer 3 side is regarded as the composition of the entire second n-type region 4b. When a thickness of the first n-type layer 4A is d, the composition of the third n-type region 4c is an average value of the compositions at depths of 0.70d, 0.80d, and 0.90d from a surface of the first n-type layer 4A on the p-type light-absorbing layer 3 side. When the first n-type layer 4A is very thin (for example, 10 nm or less), the composition at a depth of 0.80d from the surface of the first n-type layer 4A on the p-type light-absorbing layer 3 side is regarded as the composition of the entire third n-type region 4c.

The composition of the first region 4a, the second region 4b, and the third region 4c corresponds to the composition of the first n-type layer 4A, the second n-type layer 4B, and the third n-type layer 4C of the third embodiment, respectively. The solar cell 103 of the fourth embodiment is common to the solar cell 100, 101, and 102 of the first to third embodiment including the inclined composition change and the like described in the first embodiment to the third embodiment.

The solar cell 103 of the fourth embodiment also has excellent continuity of the connection at the conduction band minimum, Jsc, Voc, and FF are improved, and it contributes improving the conversion efficiency.

Fifth Embodiment

Figure 6:
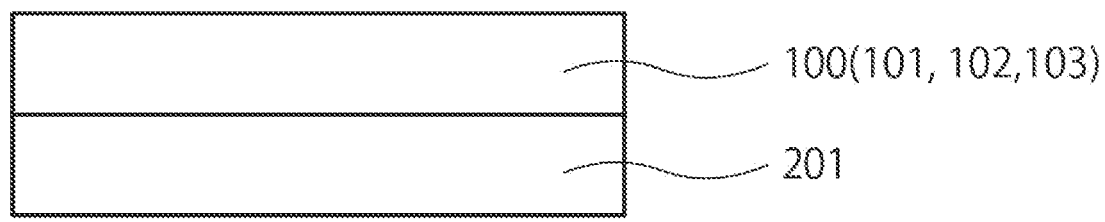
FIG. 6 is a cross-sectional view of a multi-junction solar cell according to an embodiment.

A fifth embodiment relates to a multi-junction solar cell. FIG. 6 illustrates a conceptual sectional diagram of a multi-junction solar cell 200 according to the fifth embodiment. The multi-junction solar cell 200 of FIG. 6 includes the solar cell (first solar cell) 100 of the first embodiment on the light incident side and a second solar cell 201. The band gap of the photoelectric conversion layer of the second solar cell 201 is smaller than the band gap of the light-absorbing layer 3 of the solar cell 100 according to the first embodiment. Incidentally, the multi-junction solar cell according to the embodiment includes a solar cell with three or more jointed solar cells. Incidentally, in the fifth embodiment, the solar cell 101-103 of the second embodiment to the fourth embodiment can be used instead of the solar cell 100 of the first embodiment.

The band gap of the p-type light-absorbing layer 3 of the first solar cell 100 according to the first embodiment is about 2.0 eV-2.2 eV, and thus the band gap of the light-absorbing layer of the second solar cell 200 is preferably 1.0 eV or more and 1.6 eV or less. The light-absorbing layer of the second solar cell is preferably selected from the group consisting of any one or more compound semiconductor layers among CIGS-based having a high In content, CuZnSnSSe-based, and CdTe-based compound, crystalline silicon, and perovskite type compound.

Sixth Embodiment

Figure 7:
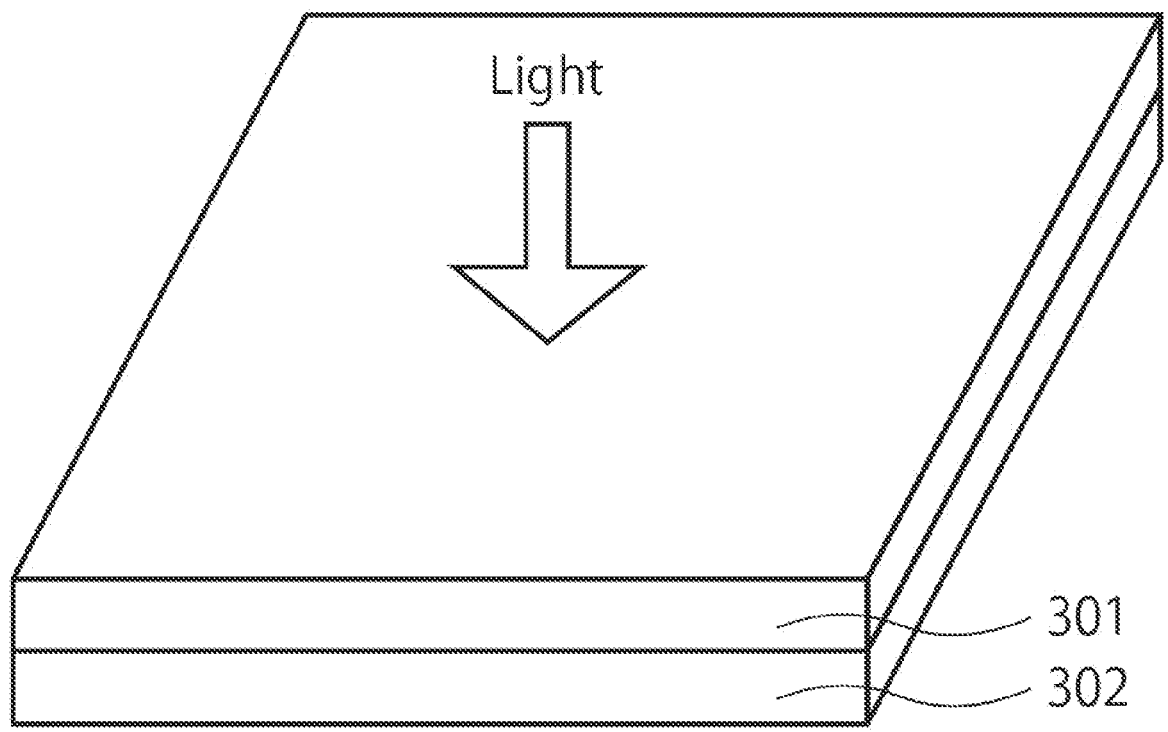
FIG. 7 is a perspective view of a solar cell module according to an embodiment.

A sixth embodiment relates to a solar cell module. FIG. 7 illustrates a perspective diagram of a solar cell module 300 according to the fifth embodiment. The solar cell module 300 in FIG. 7 is a solar cell module stacked with a first solar cell module 301 and a second solar cell module 302. The first solar cell module 301 is on the light incident side and includes the solar cell 100 according to the first embodiment. It is preferable to use the solar cell 201 in the second solar cell module 302. It is preferable to use the solar cell 101-103 of the second embodiment to the fourth embodiment in the second solar cell module 302.

Figure 8:
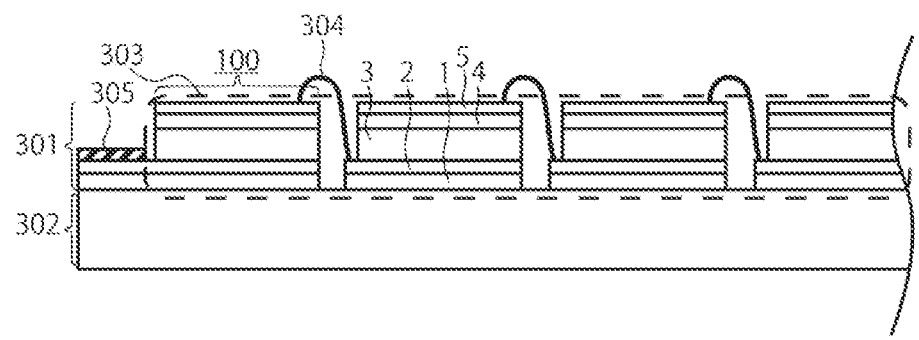
FIG. 8 is a cross-sectional view of a solar cell module according to an embodiment.

FIG. 8 illustrates a sectional diagram of the solar cell module 300. In FIG. 8, the structure of the first solar cell module 301 is illustrated in detail but the structure of the second solar cell module 302 is not illustrated. In the second solar cell module 301, the structure of the solar cell module is appropriately selected depending on the light-absorbing layer of the solar cell to be used. In the solar cell module 300 in FIG. 8, a plurality of submodules 303 with solar cells 100 which are arranged in the horizontal direction and electrically connected to each other by a wiring 304 in series and that is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Similar to the solar cell 100 of the first embodiment, the solar cell 100 of the sixth embodiment includes the substrate 1, p-electrode 2, the p-type light-absorbing layer 3, the n-type layer 4, and the n-electrode 5. It is preferable that both ends of the solar cell 100 in the submodule 303 are connected to the busbar 305. The busbar 305 is preferably configured to electrically connect a plurality of submodules 303 in parallel or in series and adjust the output voltage with the second solar cell module 302. Incidentally, the connection system of the solar cell 100 shown in the sixth embodiment is an example. The solar cell module can be configured by other connection systems.

Seventh Embodiment

Figure 9:
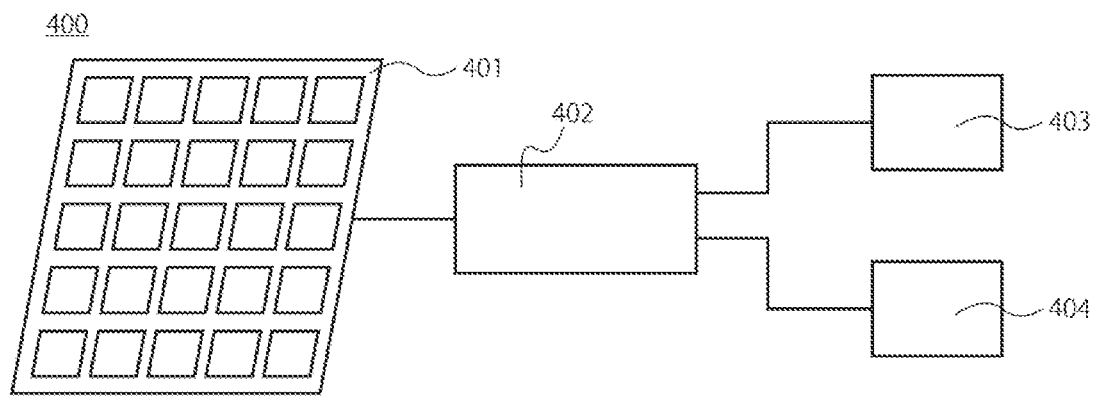
FIG. 9 is a structural view of a photovoltaic power generation system according to an embodiment.

A seventh embodiment relates to a solar photovoltaic power generation system. The solar cell module according to the sixth embodiment can be used as a generator which generates electric power in the solar photovoltaic power generation system according to the seventh embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 9 illustrates a configuration diagram of a solar photovoltaic power generation system 400 according to the embodiment. The solar photovoltaic power generation system in FIG. 9 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module.

Figure 10:
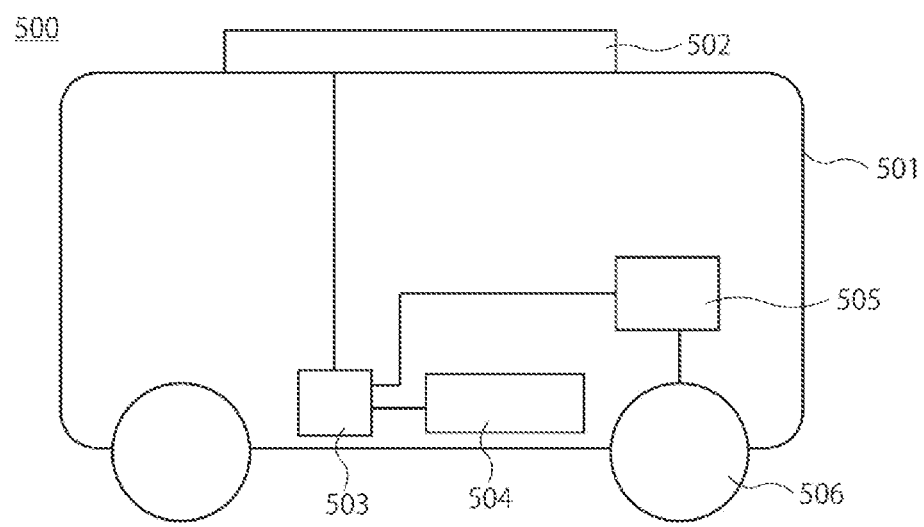
FIG. 10 is a conceptual diagram of a vehicle according to an embodiment.

A vehicle is described as an example of utilization of the solar photovoltaic power generation system 400. FIG. 10 illustrates a conceptual configuration diagram of a vehicle 500. The vehicle 500 in FIG. 10 includes a vehicle body 501, a solar cell module 502, a power converter 503, a storage battery 504, a motor 505, and tires (wheels) 506. The electric power generated by the solar cell module 501 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Hereinafter, the present disclosure will be described more specifically based on Examples, but the present disclosure is not limited to the following Examples.

Example 1

ITO (In:Sn=90:10, film thickness 20 nm) and ATO (Sn Sb=98:2, film thickness: 150 µm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen and argon gas atmosphere. Thereafter, by an ALD method, 10 nm of $Ga_{1.70}Al_{0.30}O_{3.00}$ having no composition inclination is deposited as a first n-type layer, and 10 nm of $Zn_{0.80}Sn_{0.20}O_{1.20}$ having no composition inclination as a first n-type layer and an AZO transparent conductive film as the n-electrode are deposited on the deposited surface side. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance. An oxygen composition ratio of the n-type layer is obtained from a type and a composition ratio of metal of a metal oxide.

The transmittance of the solar cell is evaluated. The transparency of the solar cell is an average transmittance when a wavelength of 700 to 1200 nm is measured with a spectrophotometer.

Examples 2 to 26 and Comparative Examples

Conditions of n-type layers of Examples and Comparative Examples are shown in a table related to Examples of FIG. 11. The same procedures as in Example 1 were carried out except for the conditions of the n-type layers (first n-type layer (first region), second n-type layer (second region)). When two-layer or three layer of the n-type layer is formed in Examples, a thickness of each n-type layer (each region) is 6 nm. In examples 25 and 26, an interface between the first n-type layer and the second n-type layer does not exist, and the n-type layer includes the first region and the second region. In example 26, there is an interface between the second region and the third n-type layer.

Figure 14:
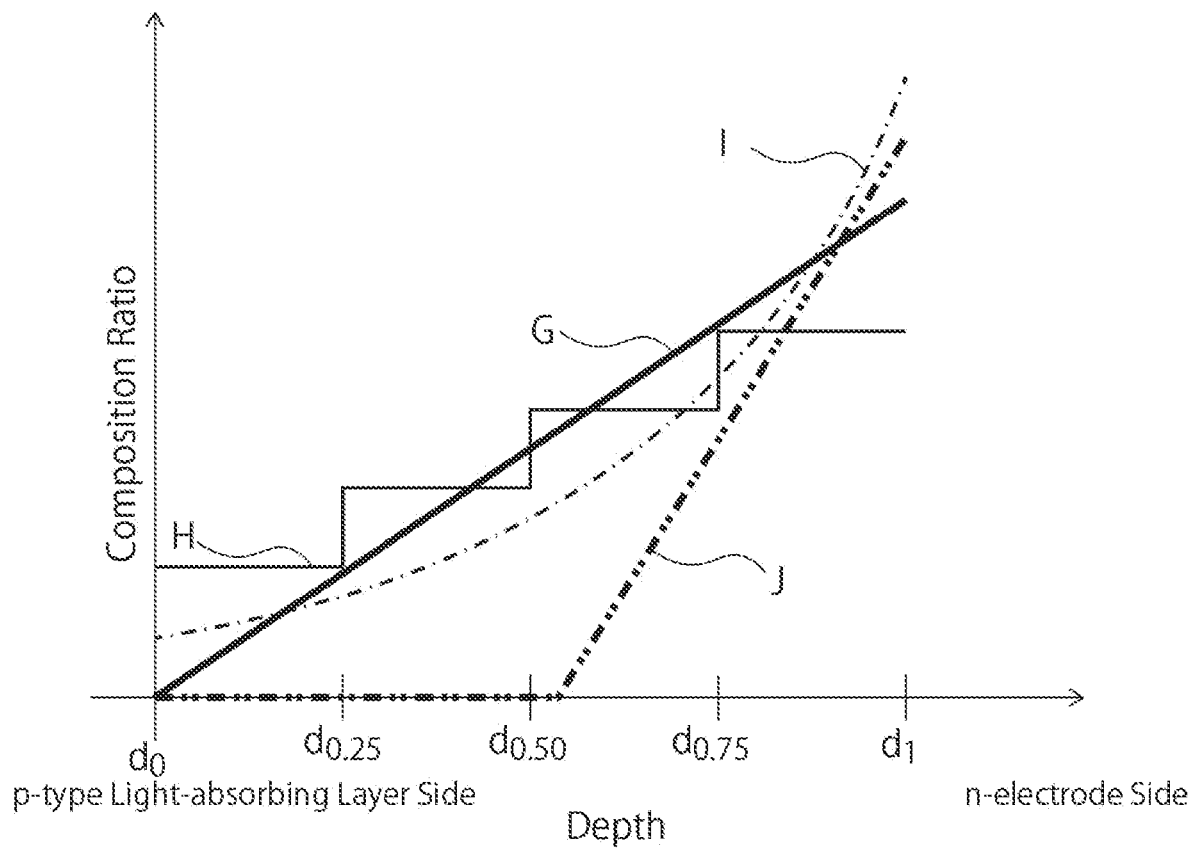
FIG. 14 is a graphs of composition change modes of Examples.

In examples 17 to 26, the composition of the n-type layer is changed in a film thickness direction (stacking direction of the p-type light-absorbing layer and the n-type layer). The composition change of each of examples is shown in a table relate to Examples of FIG. 12. Compositionally changed elements and composition change modes are shown in FIG. 12. Graphs of the composition change modes are shown in FIG. 13 and FIG. 14. The horizontal axis of the graph represents depth of the n-type layer from the p-type light-absorbing layer side toward the n-electrode side, and vertical axis represents composition ratios in FIG. 13 and FIG. 14. When composition is changed, an element which has highest composition ration in each layer or each region is changes to compensate for the changes. For example, When Al is increased by 0.1, Ga is reduced by 0.1.

In example 17, the composition of Al is changed with the composition change mode A in the first n-type layer, the composition of Al is changed with the composition change mode A in the second n-type layer, and the composition of Sn is changed with the composition changes mode J in the second n-type layer. A composition is inclinedly changed so as to be Ga:Al=1.40:0.50 at a surface of the first n-type layer on the second n-type layer side. The composition is changed so as to be Ga:Al:Sn=1.80:0.20:0.00 at a surface of the second n-type layer on the first n-type layer side, to include Sn from about half thickness of the second n-type layer, and to be Ga:Al:Sn=1.90:0.00:0.10 at a surface of the second n-type layer on the n-electrode side.

In example 18, the composition of Al is changed with the composition change mode B in the first n-type layer and the composition of Al is changed with the composition changes mode B in the second n-type layer. A composition is step-wisely changed so as to be Ga:Al=1.60:0.40 at a surface of the first n-type layer on the p-type light-absorbing layer side and to be Ga:Al=1.80:0.20 at a surface of the first n-type layer on the second n-type layer side. A target ratio is adjusted so as to be Al composition of the first n-type layer being 0.40($d_0$), 0.33($d_{0.25}$), 0.27($d_{0.50}$), 0.20($d_{0.75}$), and 0.20 ($d_1$) from the p-type light-absorbing layer side. A composition is step-wisely changed so as to be Ga:Al:Sn=1.75:0.20:0.05 at a surface of the second n-type layer on the first n-type layer side and to be Ga:Al:Sn=1.95:0.00:0.05 at a surface of the second n-type layer on the n-electrode side. A target ratio is adjusted so as to be Al composition of the second n-type layer being 0.20($d_0$), 0.13($d_{0.25}$), 0.07($d_{0.50}$). 0.00($d_{0.75}$), and 0.00($d_1$) from the first n-type layer side.

In example 19, the composition of Al is changed with the composition change mode C in the first n-type layer and the composition of Al is changed with the composition changes mode C in the second n-type layer. A composition is changed so as to be Ga:Al=1.60:0.40 at a surface of the first n-type layer on the p-type light-absorbing layer side and to be Ga:Al=1.70:0.30 at a surface of the first n-type layer on the second n-type layer side. A composition is changed so as to be Ga:Al:Sn=1.80:0.15:0.05 at a surface of the second n-type layer on the first n-type layer side and to be Ga:Al:Sn=1.90:0.05:0.05 at a surface of the second n-type layer on the n-electrode side.

In example 20, the composition of Al is changed with the composition change mode D in the first n-type layer and the composition of Al is changed with the composition change mode D in the second n-type layer. A composition is changed so as to be Ga:Al=1.50:0.50 at a surface of the first n-type layer on the p-type light-absorbing layer side, to be Ga:Al=1.70:0.30 at about half thickness of the first n-type layer, and Ga Al=1.65:0.35 at a surface of the first n-type layer on the second n-type layer side. A composition is changed so as to be Ga:Al:Sn=1.75:0.20:0.05 at a surface of the second n-type layer on the first n-type layer side, to be Ga:Al:Sn=1.90:0.05:0.05 at about half thickness of the second n-type layer, and Ga:Al:Sn=1.85:0.10:0.05 at a surface of the second n-type layer on the n-electrode side.

In example 21, the composition of Al is changed with the composition change mode F in the first n-type layer and the composition of Al is changed with the composition change mode F in the second n-type layer. A composition is changed so as to be Ga:Al=1.60:0.40 at a surface of the first n-type layer on the p-type light absorbing layer side and to be Ga:Al=1.80:0.20 from about half thickness of the first n-type layer to a surface of the second n-type layer side of the first n-type layer. A composition is changed so as to be Ga:Al:Sn=1.80:0.15: 0.05 at a surface of the second n-type layer on the first n-type layer side and to be Ga:Al:Sn=1.87:0.08:0.05 from about half thickness of the second n-type layer to a surface of the n-electrode side of the second n-type layer.

In example 22, the composition of Al is changed with the composition change mode A in the first n-type layer and the composition of Al is changed with the composition change mode A in the second n-type layer. A composition is inclinedly changed so as to be Ga:Al=1.45:0.55 at a surface of the first n-type layer on the p-type light-absorbing layer side and to be Ga:Al=1.55:0.45 at a surface of the first n-type layer on the second n-type layer side. A composition is changed so as to be Ga:Al:Sn=1.80:0.15:0.05 at a surface of the second n-type layer on the first n-type layer side and to be Ga:Al:Sn=1.90:0.05:0.05 at a surface of the second n-type layer on the n-electrode side.

In example 23, the composition of Al is changed with the composition change mode A in the first n-type layer, the composition of Hf is changed with the composition change mode C in the first n-type layer, the composition of Sn is changed with the composition change mode I in the first n-type layer, and the composition of Sn is changed with the composition change mode G in the second n-type layer. A composition is inclinedly changed so as to be Ga:Al:Hf:Sn=1.548:0.40:0.05:0.002 at a surface of the first n-type layer on the p-type light-absorbing layer side and to be Ga:Al:Hf:Sn=1.755:0.20:0.03: 0.015 at a surface of the first n-type layer on the second n-type layer side. A composition is changed so as to be Ga:Al:Sn=1.83:0.15:0.02 at a surface of the second n-type layer on the first n-type layer side and to be Ga:Al:Sn=1.87:0.05:0.08 at a surface of the second n-type layer on the n-electrode side.

In example 24, the composition of Al is changed with the composition change mode A in the first n-type layer, the composition of Hf is changed with the composition change mode E in the first n-type layer, the composition of Sn is changed with the composition change mode J in the first n-type layer, the composition of Al is changed with the composition change mode A in the second n-type layer and the composition of Sn is changed with the composition change mode H in the second n-type layer. In addition, the composition of the Sn is changed with the composition change mode H in the third n-type layer. A composition is changed so as to be Ga:Al:Hf:Sn=1.52:0.40:0.08:0.00 at a surface of the first n-type layer on the p-type light-absorbing layer side, to be Ga:Al:Hf:Sn=1.70:0.30:0.00:0.00 at about half thickness of the first n-type layer, and Ga Al:Hf:Sn=1.78:0.20:0.00:0.02 at a surface of the first n-type layer on the second n-type layer side. A composition is changed so as to be Ga:Al:Sn=1.83:0.15:0.02 at a surface of the second n-type layer on the first n-type layer side and to be Ga:Al:Sn=1.87:0.05:0.08 at a surface of the second n-type layer on the third n-type layer side. A composition is step-wisely changed so as to be Zn:Sn=1.85:0.15 at a surface of the third n-type layer on the first n-type layer side and to be Zn:Sn=1.55:0.45 at a surface of the third n-type layer on the n-electrode side.

In example 25 and example 26, the composition of Al is changed with the composition change mode A in the first region and the second region. A composition is changed so as to be Ga:Al=1.40:0.60 at a surface of the n-type layer on the p-type light-absorbing layer side, to be Ga:Al=1.60:0.40 at 3 nm depth from the surface of the n-type layer on the p-type light-absorbing layer side toward the n-electrode, to be Ga:Al=1.80:0.20 at 6 nm depth (boundary between the first region and the second region) from the surface of the n-type layer on the p-type light-absorbing layer side toward the n-electrode, to be Ga:Al=1.90:0.10 at 9 nm depth from the surface of the n-type layer on the p-type light-absorbing layer side toward the n-electrode, and to be Ga:Al=2.00:0.00 at 12 nm depth (boundary between the second region and third region or the n-electrode) from the surface of the n-type layer on the p-type light-absorbing layer side toward the n-electrode.

The amount of light is adjusted to 1 sun by using a solar simulator simulating a light source of AM 1.5G and using a reference Si cell under a light source. A temperature in a measurement chamber is 25° C. under an atmospheric pressure. A voltage is swept and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In a table related to Examples of FIG. 16, the short circuit current (Jsc), the open circuit voltage (Voc), the fill factor (FF), the conversion efficiency, and the light transmittance of Examples and Comparative Examples are collectively illustrated.

The transmittance is evaluated as A when the transmittance of light in a wavelength band of 700 nm or more and 1200 nm or less is 75% or more, is evaluated as B when the transmittance of light in a wavelength band of 700 nm or more and 1200 nm or less is 70% or more and less than 75%, and is evaluated as C when the transmittance of light in a wavelength band of 700 nm or more and 1200 nm or less is less than 70%.

Jsc is evaluated as A when the conversion efficiency is 1.1 times or more the conversion efficiency of Comparative Example 1, is evaluated as B when the conversion efficiency is 1.0 times or more and less than 1.1 times Jsc of Comparative Example 1, and is evaluated as C when the conversion efficiency is less than 1.0 times Jsc of Comparative Example 1.

Voc is evaluated as A when Voc is 1.3 times or more the conversion efficiency of Comparative Example 1, is evaluated as B when Voc is 1.1 times or more and less than 1.3 times Voc of Comparative Example 1, and is evaluated as C when Voc is less than 1.1 times Voc of Comparative Example 1.

FF is evaluated as A when FF is 1.1 times or more the conversion efficiency of Comparative Example 1, is evaluated as B when FF is 1.0 times or more and less than 1.1 times FF of Comparative Example 1, and is evaluated as C when FF is less than 1.0 times FF of Comparative Example 1.

The conversion efficiency is evaluated as A when the conversion efficiency is 1.5 times or more the conversion efficiency of Comparative Example 1, is evaluated as B when the conversion efficiency is 1.1 times or more and less than 1.5 times the conversion efficiency of Comparative Example 1, and is evaluated as C when the conversion efficiency is less than 1.1 times the conversion efficiency of Comparative Example 1.

As can be seen from the table of FIG. 15, by applying a multilayer structure or an inclined structure in which the composition is intentionally controlled to the n-type layer in order to connect the conduction band energetically and smoothly between the p-type light-absorbing layer and the n-electrode, each of Jsc, Voc, and FF is improved and the efficiency is greatly improved as compared with the comparative example. From the above results, it is understood that it is an important technique for controlling and optimizing an energy structure of the conduction band of the n-type layer in the film thickness direction in order to improve the characteristics of the $Cu_2O$ solar cell.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a p-electrode;
   an n-electrode;
   a p-type light-absorbing layer located between the p-electrode and the n-electrode and mainly containing a cuprous oxide; and
   an n-layer including
   a first n-type layer which is located between the p-type light-absorbing layer and the n-electrode and mainly contains a compound represented by $Ga_{x1}M1_{x2}M2_{x3}M3_{x4}O_{x5}$, the M1 being Al or/and B, the M2 being one or more selected from the group consisting of In, Ti, Zn, Hf, and Zr, the M3 being one or more selected from the group consisting of Sn, Si, and Ge, the x1 and the x5 being more than 0, the x2, the x3, and the x4 being 0 or more, a sum of the x1, the x2, the x3, and the x4 being 2, and the x5 being 3.0 or more and 3.8 or less, and a second n-type layer which is located between the first n-type layer and the n-electrode and mainly contains a compound represented by $Ga_{y1}M1_{y2}M2_{y3}M3_{y4}O_{y5}$, the y1 and the y5 being more than 0, the y2, the y3, and the y4 being 0 or more, a sum of the y1, the y2, the y3, and the y4 being 2, and the y5 being 3.0 or more and 3.8 or less, or
   a first n-type region which is located between the p-type light-absorbing layer and the n-electrode and mainly contains a compound represented by $Ga_{x1}M1_{x2}M2_{x3}M3_{x4}O_{x5}$, the M1 being Al or/and B, the M2 being one or more selected from the group consisting of In, Ti, Zn, Hf, and Zr, the M3 being one or more selected from the group consisting of Sn, Si, and Ge, the x1 and the x5 being more than 0, the x2, the x3, and the x4 being 0 or more, a sum of the x1, the x2, the x3, and the x4 being 2, and the x5 being 3.0 or more and 3.8 or less, and a second n-type region which is located between the first n-type region and the n-electrode and mainly contains a compound represented by $Ga_{y1}M1_{y2}M2_{y3}M3_{y4}O_{y5}$, the y1 and the y5 being more than 0, the y2, the y3, and the y4 being 0 or more, a sum of the y1, the y2, the y3, and the y4 being 2, and the y5 being 3.0 or more and 3.8 or less,
   wherein (x2+x3) is larger than (y2+y3), and
   x4/(x1+x2+x3+x4) is 0.00 or more and 0.15 or less.

2. The solar cell according to claim 1,
   wherein (x1+x2)/(x1+x2+x3+x4) is 0.50 or more and 1.00 or less,
   x2/(x1+x2) is 0.00 or more and 0.50 or less,
   x3/(x1+x2+x3+x4) is 0.00 or more and 0.50 or less, and
   (y2+y3) is 0.8 times or less of (x2+x3).

3. The solar cell according to claim 1,
   wherein (x1+x2)/(x1+x2+x3+x4) is 0.80 or more and 1.00 or less,
   x2/(x1+x2) is 0.00 or more and 0.40 or less,
   x3/(x1+x2+x3+x4) is 0.00 or more and 0.10 or less, and
   x4/(x1+x2+x3+x4) is 0.00 or more and 0.10 or less.

4. The solar cell according to claim 1,
   wherein (y1+y2)/(y1+y2+y3+y4) is 0.65 or more and 1.00 or less,
   y2/(y1+y2) is 0.00 or more and 0.30 or less,
   the y2 is 90% or less of the x2,
   y3/(y1+y2+y3+y4) is 0.00 or more and 0.10 or less, and
   y4/(y1+y2+y3+y4) is 0.00 or more and 0.15 or less.

5. The solar cell according to claim 1,
   wherein (y1+y2)/(y1+y2+y3+y4+y5) is 0.80 or more and 1.00 or less,
   y2/(y1+y2) is 0.00 or more and 0.20 or less,
   the y2 is 80% or less of the x2,
   y3/(y1+y2+y3+y4) is 0.00 or more and 0.05 or less, and
   y4/(y1+y2+y3+y4) is 0.01 or more and 0.15 or less.

6. The solar cell according to claim 5,
   wherein the n-type layer further includes a third n-type layer which is located between the second n-type layer and the n-electrode and mainly contains a compound represented by $Ga_{z1}Zn_{z2}Sn_{z3}M4_{z4}O_{z5}$, the M4 being one or more selected from the group consisting of Hf, Zr, In, Ti, Al, B, Mg, Si, and Ge, the z1, the z2, and the z4 being 0 or more, the z3 being 0 or more, a sum of the z1, the z2, the z3, and the z4 being 2, and the z5 being 2.2 or more and 3.6 or less, or a third region which is located between the second region and the n-electrode and mainly contains a compound represented by $Ga_{z1}Zn_{z2}Sn_{z3}M4_{z4}O_{z5}$, the M4 being one or more selected from the group consisting of Hf, Zr, In, Ti, Al, B, Mg, Si, and Ge, the z1, the z2, and the z4 being 0 or more, the z3 being 0 or more, a sum of the z1, the z2, the z3, and the z4 being 2, and the z5 being 2.2 or more and 3.6 or less.

7. The solar cell according to claim 6,
wherein (z1+z2)/(z1+z2+z3+z4) is 0.60 or more and 0.98 or less,
z3/(z1+z2+z3+z4) is 0.10 or more and 0.50 or less, and
z4/(z1+z2+z3+z4) is 0.00 or more and 0.05 or less.

8. The solar cell according to claim 6,
wherein (z1+z2)/(z1+2+z3+z4) is 0.65 or more and 0.95 or less, and
z3/(z1+z2+z3+z4) is 0.15 or more and 0.30 or less.

9. The solar cell according to claim 1,
wherein, when a thickness of the first n-type layer is $d_{4A}$,
an element ratio of the M1 in a region $d_{A0-0.25}$ from a surface of the first n-type layer on the p-type light-absorbing layer side to a depth of $0.25d_{4A}$ toward the second n-type layer is 1.10 times or more and 2.50 times or less of the x2,
an element ratio of the M1 in a region $d_{A0.25-0.50}$ from the depth of $0.25d_{4A}$ from the surface of the first n-type layer on the p-type light-absorbing layer side toward the second n-type layer to a depth of $0.50d_{4A}$ toward the second n-type layer is 0.75 times or more and 1.50 times or less of the x2,
an element ratio of the M1 in a region $d_{A0.50-0.75}$ from the depth of $0.50d_{4A}$ from the surface of the first n-type layer on the p-type light-absorbing layer side toward the second n-type layer to a depth of $0.75d_{4A}$ toward the second n-type layer is 0.30 times or more and 1.50 times or less of the x2, and
an element ratio of the M1 in a region $d_{A0.75-1}$ from the depth of $0.75d_{4A}$ from the surface of the first n-type layer on the p-type light-absorbing layer side toward the second n-type layer to a depth of $1.00d_{4A}$ toward the second n-type layer is 0.10 times or more and 0.90 times or less of the x2.

10. The solar cell according to claim 9,
wherein the element ratio of the M1 of the region $d_{A0-0.25}$ is equal to the element ratio of the M1 of the region $d_{A0.25-0.50}$ or more,
the element ratio of the M1 of the region $d_{A0.25-0.50}$ is equal to the element ratio of the M1 of the region $d_{A0.50-0.75}$ or more,
the element ratio of the M1 of the region $d_{A0.50-0.75}$ is equal to the element ratio of the M1 of the region $d_{A0.75-1}$ or more, and
the element ratio of the M1 of the region $d_{A0.75-1}$ is equal to half or less of the element ratio of the M1 of the region $d_{A0-0.25}$.

11. The solar cell according to claim 1,
wherein, when a thickness of the first n-type layer is $d_{4A}$,
an element ratio of Ga in a region $d_{A0-0.25}$ from a surface of the first n-type layer on the p-type light-absorbing layer side to a depth of $0.25d_{4A}$ toward the second n-type layer is 0.75 times or more and 0.98 times or less of the x1,
an element ratio of Ga in a region $d_{A0.25-0.50}$ from the depth of $0.25d_{4A}$ from the surface of the first n-type layer on the p-type light-absorbing layer side toward the second n-type layer to a depth of $0.50d_{4A}$ toward the second n-type layer is 0.80 times or more and 1.10 times or less of the x1,
an element ratio of Ga in a region $d_{A0.50-0.75}$ from the depth of $0.50d_{4A}$ from the surface of the first n-type layer on the p-type light-absorbing layer side toward the second n-type layer to a depth of $0.75d_{4A}$ toward the second n-type layer is 0.90 times or more and 1.20 times or less of the x1, and
an element ratio of Ga in a region $d_{A0.75-1}$ from the depth of $0.75d_{4A}$ from the surface of the first n-type layer on the p-type light-absorbing layer side toward the second n-type layer to a depth of $1.00d_{4A}$ toward the second n-type layer is 1.02 times or more and 1.25 times or less of the x1.

12. The solar cell according to claim 11,
wherein the element ratio of Ga of the region $d_{A0-0.25}$ is equal to the element ratio of Ga of the region $d_{A0.25-0.50}$ or less,
the element ratio of Ga of the region $d_{A0.25-0.50}$ is equal to the element ratio of Ga of the region $d_{A0.50-0.75}$ or less, and
the element ratio of Ga of the region $d_{A0.50-0.75}$ is equal to the element ratio of Ga of the region $d_{A0.75-1}$ or less.

13. The solar cell according to claim 1,
wherein, when a thickness of the second n-type layer is $d_{4B}$,
an element ratio of the M1 in a region $d_{B0-0.25}$ from a surface of the second n-type layer on the first n-type layer side to a depth of $0.25d_{4B}$ toward the n-electrode is 1.10 times or more and 4.00 times or less of the y2,
an element ratio of the M1 in a region $d_{B0.25-0.50}$ from the depth of $0.25d_{4B}$ from the surface of the second n-type layer on the first n-type layer side toward the n-electrode to a depth of $0.50d_{4B}$ toward the n-electrode is 0.00 times or more and 1.50 times or less of the y2,
an element ratio of the M1 in a region $d_{B0.50-0.75}$ from the depth of $0.50d_{4B}$ from the surface of the second n-type layer on the first n-type layer side toward the n-electrode to a depth of $0.75d_{4B}$ toward the n-electrode is 0.00 times or more and 1.25 times or less of the y2, and
an element ratio of the M1 in a region $d_{B0.75-1}$ from the depth of $0.75d_{4B}$ from the surface of the second n-type layer on the first n-type layer side toward the n-electrode to a depth of $1.00d_{4B}$ toward the n-electrode is 0.00 times or more and 0.90 times or less of the y2.

14. The solar cell according to claim 13,
wherein the element ratio of the M1 of the region $d_{B0-0.25}$ is equal to the element ratio of the M1 of the region $d_{B0.25-0.50}$ or more,
the element ratio of the M1 of the region $d_{B0.25-0.50}$ is equal to the element ratio of the M1 of the region $d_{B0.50-0.75}$ or more,
the element ratio of the M1 of the region $d_{B0.50-0.75}$ is equal to the element ratio of the M1 of the region $d_{B0.75-1}$ or more, and
the element ratio of the M1 of the region $d_{B0.75-1.00}$ is equal to half or less of the element ratio of the M1 of the region $d_{A0-0.25}$.

15. The solar cell according to claim 1,
wherein, when a thickness of the second n-type layer is $d_{4B}$,
an element ratio of the M3 in a region $d_{B0-0.25}$ from a surface of the second n-type layer on the first n-type layer side to a depth of $0.25d_{4B}$ toward the n-electrode is 0.00 times or more and 0.75 times or less of the y4,
an element ratio of the M3 in a region $d_{B0.25-0.50}$ from the depth of $0.25d_{4B}$ from the surface of the second n-type layer on the first n-type layer side toward the n-electrode to a depth of $0.50d_{4B}$ toward the n-electrode is 0.30 times or more and 1.50 times or less of the y4,
an element ratio of the M3 in a region $d_{B0.50-0.75}$ from the depth of $0.50d_{4B}$ from the surface of the second n-type layer on the first n-type layer side toward the n-electrode to a depth of $0.75d_{4B}$ toward the n-electrode is 0.75 times or more and 2.00 times or less of the y4, and an element ratio of the M3 in a region $d_{B0.75\text{-}1}$ from the depth of $0.75d_{4B}$ from the surface of the second n-type layer on the first n-type layer side toward the n-electrode to a depth of $1.00d_{4B}$ toward the n-electrode is 1.10 times or more and 3.00 times or less of the y4.

16. The solar cell according to claim 15,
wherein the element ratio of the M3 of the region $d_{B0\text{-}0.25}$ is equal to the element ratio of the M3 of the region $d_{B0.25\text{-}0.50}$ or less, the element ratio of the M3 of the region $d_{B0.25\text{-}0.50}$ is equal to the element ratio of the M3 of the region $d_{B0.50\text{-}0.75}$ or less, the element ratio of the M3 of the region $d_{B0.50\text{-}0.75}$ is equal to the element ratio of the M3 of the region $d_{B0.75\text{-}1}$ or less, and the element ratio of the M3 of the region $d_{B0\text{-}0.25}$ is equal to half or less of the element ratio of the M3 of the region $d_{A0.75\text{-}1.00}$.

17. The solar cell according to claim 1,
wherein the p-electrode includes one or more transparent conductive films.

18. A multi-junction solar cell comprising:
the solar cell according to claim 1; and
a solar cell including a light-absorbing layer in which a band gap is smaller than a band gap of the p-type light-absorbing layer of the solar cell according to claim 1.

19. A solar cell module using the solar cell according to claim 1.

20. A photovoltaic power generation system that performs photovoltaic power generation by using the solar cell module according to claim 19.

* * * * *